United States Patent
Lee et al.

(10) Patent No.: US 11,698,852 B2
(45) Date of Patent: Jul. 11, 2023

(54) APPARATUS AND METHOD FOR WRITING DATA IN A MEMORY

(71) Applicant: SAMSUNG ELECTRONICS CO., LTD., Suwon-si (KR)

(72) Inventors: Jaeshin Lee, Seoul (KR); Eunhye Oh, Yongin-si (KR); Jaechul Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 180 days.

(21) Appl. No.: 16/913,707

(22) Filed: Jun. 26, 2020

(65) Prior Publication Data

US 2021/0165733 A1 Jun. 3, 2021

(30) Foreign Application Priority Data

Nov. 28, 2019 (KR) .................. 10-2019-0156121

(51) Int. Cl.
*G06F 12/02* (2006.01)
*G06F 13/16* (2006.01)
(Continued)

(52) U.S. Cl.
CPC ...... *G06F 12/0238* (2013.01); *G06F 9/30101* (2013.01); *G06F 9/30189* (2013.01);
(Continued)

(58) Field of Classification Search
None
See application file for complete search history.

(56) References Cited

U.S. PATENT DOCUMENTS

| 5,359,723 A | 10/1994 | Mathews et al. |
| 5,469,555 A | 11/1995 | Ghosh et al. |

(Continued)

FOREIGN PATENT DOCUMENTS

| JP | 1994-035787 | 2/1994 |
| JP | 1994-635787 | 2/1994 |

(Continued)

OTHER PUBLICATIONS

Peter Bishop. "Using ARM Processor-based Flash MCUs as a Platform for Custom Systems-on-Chip." 2005. https://web.archive.org/web/20100801000000*/https://www.design-reuse.com/articles/13742/using-arm-processor-based-flash-mcus-as-a-platform-for-custom-systems-on-chip.html.*

(Continued)

*Primary Examiner* — Nathan Sadler
(74) *Attorney, Agent, or Firm* — F. Chau & Associates, LLC

(57) ABSTRACT

A device for writing data to a memory, the device including: a first write buffer having a first data width that matches a width of write data included in a write request and wherein the first write buffer is configured to store the write data as first data; a second write buffer having a second data width that matches a data width of the memory and is greater than the first data width; and a controller configured to, based on a write address included in the write request and an address of the second data stored in the second write buffer, write the first data stored in the first write buffer to the second write buffer and write the second data stored in the second write buffer to the memory.

16 Claims, 22 Drawing Sheets

(51) Int. Cl.
  *G11C 7/10* (2006.01)
  *G06F 12/0891* (2016.01)
  *G06F 9/30* (2018.01)
  *G06F 9/54* (2006.01)
  *G06F 11/14* (2006.01)

(52) U.S. Cl.
  CPC .......... *G06F 9/544* (2013.01); *G06F 11/1451* (2013.01); *G06F 11/1469* (2013.01); *G06F 12/0891* (2013.01); *G06F 13/1673* (2013.01); *G11C 7/1039* (2013.01); *G06F 2212/1021* (2013.01)

(56) References Cited

U.S. PATENT DOCUMENTS

| | | | |
|---|---|---|---|
| 7,231,497 | B2 | 6/2007 | Trika et al. |
| 7,233,880 | B2 | 6/2007 | Coulson et al. |
| 9,514,052 | B2 | 12/2016 | Gill |
| 9,678,877 | B2 | 6/2017 | Conley et al. |
| 9,836,403 | B2 | 12/2017 | Johar et al. |
| 9,916,105 | B1* | 3/2018 | Asnaashari ............ G06F 3/0679 |
| 10,025,711 | B2 | 7/2018 | Sassone et al. |
| 10,042,725 | B2 | 8/2018 | Noguchi et al. |
| 10,275,372 | B1 | 4/2019 | Intrater et al. |
| 2013/0073812 | A1 | 3/2013 | Kanai et al. |
| 2013/0097366 | A1* | 4/2013 | Shim ................... G06F 3/0679 711/103 |
| 2013/0151760 | A1* | 6/2013 | Cho ................... G06F 12/0246 711/103 |
| 2013/0346671 | A1* | 12/2013 | Michael ............... G06F 3/0679 711/E12.008 |
| 2014/0258606 | A1* | 9/2014 | Nakanishi ........... G06F 12/0246 711/105 |
| 2015/0293850 | A1* | 10/2015 | Shindo ................ G06F 12/0862 711/137 |
| 2016/0034351 | A1* | 2/2016 | Michael .............. G06F 11/1048 714/758 |
| 2018/0267853 | A1 | 9/2018 | Saida et al. |
| 2019/0035437 | A1* | 1/2019 | Zimmerman ........ G11C 7/1009 |
| 2020/0097408 | A1* | 3/2020 | Lee ..................... G11C 11/4093 |
| 2021/0142855 | A1* | 5/2021 | Na .......................... G11C 16/14 |

FOREIGN PATENT DOCUMENTS

| | | |
|---|---|---|
| JP | 1994-348592 | 12/1994 |
| JP | 1994-6348592 | 12/1994 |
| JP | 2008-129771 | 6/2008 |
| JP | 2008-544359 | 12/2008 |
| KR | 10-1555194 | 9/2015 |
| KR | 10-1977866 | 5/2019 |

OTHER PUBLICATIONS

Hatanaka et al. "Ferroelectric (Fe)-NAND Flash Memory With Batch Write Algorithm and Smart Data Store to the Nonvolatile Page Buffer for Data Center Application High-Speed and Highly Reliable Enterprise." Oct. 2010. IEEE. IEEE Journal of Solid-State Circuits. vol. 45. pp. 2156-2164.*

Kim et al. "Partial Page Buffering for Consumer Devices with Flash Storage." Sep. 2013. IEEE. ICCE—Berlin. pp. 177-180.*

Kang et al. "Subpage-Aware Solid State Drive for Improving Lifetime and Performance." Oct. 2018. IEEE. IEEE Transactions on Computers. vol. 67. pp. 1492-1505.*

Natsui et al., "Design of a Memory-Access Controller with 3.71-Times-Enhanced Energy Efficiency for Internet-of-Things-Oriented Nonvolatile Microcontroller Unit", Japanese Journal of Applied Physics, 2018, pp. 04FN03-1-04FN03-5.

Xie et al., "A Novel STT-RAM-Based Hybrid Cache for Intermittently Powered Processors in IoT Devices", Emerging Memory Technologies, IEEE, 2018, pp. 24-32.

* cited by examiner

APPARATUS AND METHOD FOR WRITING DATA IN A MEMORY

CROSS-REFERENCE TO RELATED APPLICATION

This application claims priority under 35 U.S.C. § 119 to Korean Patent Application No. 10-2019-0156121, filed on Nov. 28, 2019, in the Korean Intellectual Property Office, the disclosure of which is incorporated by reference herein in its entirety.

TECHNICAL FIELD

The inventive concept relates to data writing, and more particularly, to a device and method for writing data to a memory.

DISCUSSION OF RELATED ART

Semiconductor memory is a digital electronic semiconductor device used for digital data storage. Such memories or memory devices may be manufactured by a semiconductor process, and may store data in response to a data write command or may output stored data in response to a data read command. The memories may be formed with a variety of structures and may have different characteristics according to the structures. Various devices, which use memories to store data and use the stored data, may require high-performance memories. Accordingly, memories have been designed, which have structures that include characteristics such as fast operation speed, high storage capacity, high durability, and non-volatility. However, these memory structures may have certain disadvantageous characteristics that need to be compensated.

SUMMARY

According to an exemplary embodiment of the inventive concept, there is provided a device for writing data to a memory, the device including: a first write buffer having a first data width that matches a width of write data included in a write request and wherein the first write buffer is configured to store the write data; a second write buffer having a second data width that matches a data width of the memory and is greater than the first data width; and a controller configured to, based on a write address included in the write request and an address of the second data stored in the second write buffer, write first data stored in the first write buffer to the second write butler and write the second data stored in the second write buffer to the memory.

According to an exemplary embodiment of the inventive concept, there is provided a device for writing data to a memory, the device including: a first write buffer having a first data width that matches a width of write data included in a write request and wherein the first write buffer is configured to store the write data; a second write buffer having a second data width that matches a data width of the memory and is greater than the first data width; and a controller configured to update a portion of second data with first data stored in the first write buffer when a region of the memory corresponding to a write address included in the write request is included in a region of the memory corresponding to an address of the second data stored in the second write buffer so that a hit occurs in the second write buffer, and to write the second data to the memory based on an update state of the second data when the region of the memory corresponding to the write address included in the write request is not included in the region of the memory corresponding to the address of the second data stored in the second write buffer so that a miss occurs in the second write buffer.

According to an exemplary embodiment of the inventive concept, there is provided a method of writing data to a memory, the method including: receiving a write request including a write command, write data, and a write address; writing, in response to the write command, the write data to a first write buffer having a first data width that matches a width of the write data; writing first data stored in the first write buffer to a second write buffer based on the write address and an address of second data stored in the second write buffer, the second write buffer having a second data width that matches a data width of the memory and is greater than the first data width; and writing the second data to the memory based on the write address and the address of the second data stored in the second write buffer.

According to an exemplary embodiment of the inventive concept, there is provided a device for writing data to a memory, the device including: a first write buffer configured to store first data, the first write buffer having a first data width; a second write buffer having a second data width greater than the first data width, the second write buffer configured to store second data in a partially valid state, and when the second data is in the partially valid state, the memory stores partially valid data; and a controller configured to instruct the memory to provide the second write buffer with data read from a region of the memory corresponding to the second data and update an invalid portion of the second data with the data read from the memory such, that the second data stored in the second write buffer is in an entirety valid state, the controller further configured to instruct the second write buffer to write the all of the second data stored in the second write buffer to the memory and to instruct the first write buffer to write the first data to the second write buffer.

BRIEF DESCRIPTION OF THE DRAWINGS

The above and other features of the inventive concept will be more clearly understood by describing in detail exemplary embodiments thereof in conjunction with the accompanying drawings in which.

DETAILED DESCRIPTION OF THE EMBODIMENTS

Figure 1:
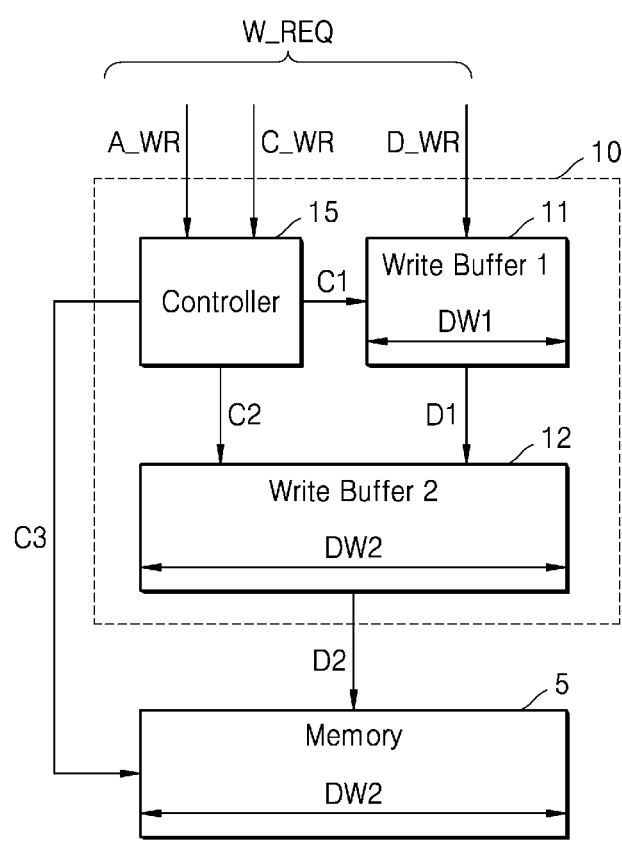
FIG. 1 is a block diagram illustrating a data writing device according to an exemplary embodiment of the inventive concept.

FIG. 1 is a block diagram illustrating a data writing device according to an exemplary embodiment of the inventive concept. For example, FIG. 1 illustrates a data writing device 10 along with a memory 5. Herein, the data writing device 10 may be referred to as a device for processing a write request. W_REQ for a memory or a device for processing a write request W_REQ. In exemplary embodiments of the inventive concept, the data writing device 10 and/or the memory 5 may be manufactured by a semiconductor process. For example, the data writing device 10 and the memory 5 may be included together in a single chip as described below with reference to FIG. 15, or may be included in separate chips as described below with reference to FIG. 16.

The memory 5 may be referred to as a memory device and may have any structure capable of storing externally received data and outputting stored data. In exemplary embodiments of the inventive concept, the memory 5 may include a volatile memory such as dynamic random access memory (DRAM), static random access memory (SRAM), and the like. The memory 5 may also include a non-volatile memory such as flash memory, electrically erasable and programmable read only memory (EEPROM), phase change memory, phase change memory and switch (PCMS), resistive random access memory (RRAM), ferroelectric memory, spin-transfer torque random access memory (STT-RAM), spin tunneling random access memory (STRAM), magnetoresistive memory, magnetic memory, magnetic random access memory (MRAM), semiconductor-oxide-nitride-oxide-semiconductor (SONGOS) memory, and the like.

The memory 5 may have a second data width DW2. The data width of the memory 5, e.g., the second data width. DW2, may correspond to a size of data which is simultaneously writable in the memory 5. In exemplary embodiments of the inventive concept, the memory 5 may write data on a block-by-block (or page-by-page) basis due to a structure of the memory 5, and the second data width DW2 may correspond to a size of the block. The size of the block, e.g., the second data width DW2, may be greater than a first data width DW1 that will be described later, and may be, but is not limited to, 64 bits or 128 bits. As illustrated in FIG. 1, the memory 5 may receive second data D2 having the second data width DW2 and a third control signal C3 from the data writing device 10, and may store the second data D2 based on the third control signal C3. In other words, the memory 5 may store the second data D2 in response to the third control signal C1.

Herein, the data writing device 10 may receive the write request W_REQ, for the memory 5 and may process the write request W_REQ. The write request W_REQ may be referred to as a write message, and may include a write address A_WR, a write command and write data D_WR as illustrated in FIG. 1. The write address A_WR may indicate a location in which the write data D_WR is to be stored in the memory 5, and the write command C_WR may indicate that a request provided to the data writing device 10 is the write request W_REQ. In other words, the write command C_WR may indicate the type of request being provided to the data writing device 10. Although FIG. 1 illustrates the write address A_WR, the write command C_WR, and the write data D_WR as being separately received, in exemplary embodiments of the inventive concept, the data writing device 10 may extract the write address A_WR, the write command C_WR, and the write data D_WR by receiving and decoding the write request W_REQ. Furthermore, in exemplary embodiments of the inventive concept, at least two of the write address A_WR, the write command C_WR, and the write data D_WR may be received at different timings.

Figure 6:
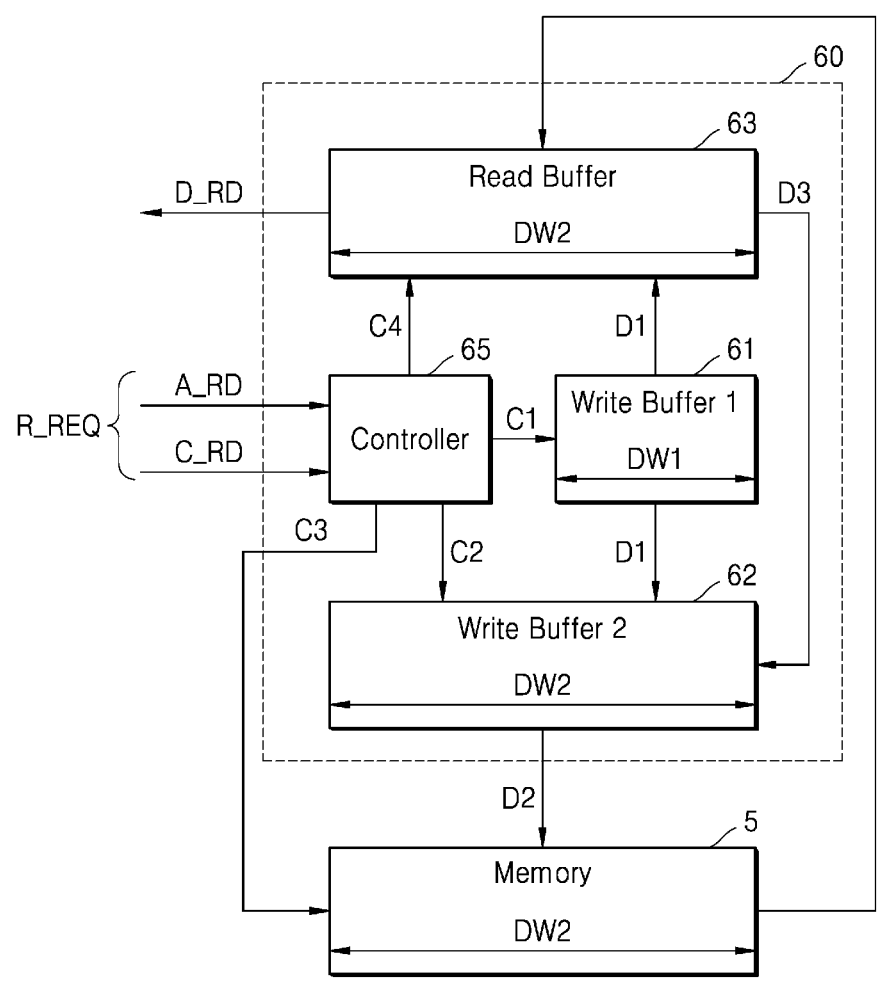
FIG. 6 is a block diagram illustrating a data writing device according to an exemplary embodiment of the inventive concept.

A request for the memory 5, which includes the write request W_REQ and the read request R_REQ of FIG. 6, may be provided from any device which is to use the memory 5. For example, the write request W_REQ may be provided by a processor including at least one core and/or a functional block designed to perform a particular function, or may be provided from a host system via a memory interface. Furthermore, the write request W_REQ may be provided from a device exclusively connected to the data writing device 10, or, when the data writing device 10 is connected to a bus, the write request W_REQ may be provided from any of a plurality of bus-connected devices.

The write data D_WR may have the first data width DW1. For example, a device or bus connected to the data writing device 10 to provide the write request W_REQ may operate based on data having, the first data width DW1. The first data width DW1 may be less than the second data width DW2 and may be, but is not limited to, 8 bits or 16 bits. In exemplary embodiments of the inventive concept, the first data width DW1 may vary due to a device or bus that provides the write request W_REQ. As described below, the data writing device 10 may resolve issues caused by a difference between the first data width DW1 and the second data width DW2, and thus, may efficiently process the write request W REQ. As illustrated in FIG. 1, the data writing device 10 may include a first write buffer 11, a second write buffer 12, and a controller 15.

The first write buffer 11 may have the first data width DW1, and data having the first data width DW1, e.g., the write data D_WR, may be, written in the first write buffer 1 at one time. The first write buffer 11 may have a fast operation speed and may include, but is not limited to, a plurality of registers. As illustrated in FIG. 1, the first write buffer 11 may receive a first control signal C1 from the controller 15 and may store the write data D_WR or may provide stored first data D1 to the second write buffer 12 based on the first control signal C1. Herein, the first data D1 may refer to data having the first data width DW1 and stored in the first write buffer 11.

The second write buffer 12 may have the second data width DW2, and data having the second data width DW2, e.g., the second data D2 stored in the second write buffer 12, may be simultaneously read from the second write buffer 12. Similarly to the first write buffer 11, the second write buffer 12 may have a fast operation speed and may include, but is not limited to, a plurality of registers. As illustrated in FIG. 1, the second write buffer 12 may receive a second control signal C2 from the controller 15 and may store the first data D1 or may provide the second data D2 to the memory 5 based on the second control signal C2. Herein, the second data D2 may refer to data having the second data width DW2 and stored in the second write buffer 12. In exemplary embodiments of the inventive concept, the second write buffer 12 may support overwriting, and, therefore, a portion of the second data D2 may be updated with the first data D1, or a portion of the second data D2 may be updated with a portion of data read from the memory 5.

The controller 15 may receive the write address A_WR and the write command C_WR included in the write request W_REQ and may generate the first, second and third control signals C1, C2 and C3. For example, the controller 15 may generate, in response to the write command C_WR, the first control signal C1 so that the write data D_WR may be written in the first write buffer DW1. Furthermore, the controller 15 may generate, based on the write address A_WR and an address of the second data D2, the first control signal C1 and the second control signal C2 so that the first data D1 may be written in the second write buffer 12. Furthermore, the controller 15 may generate, based on the write address A_WR and an address of the second data D2, the second control signal C2 and the third control signal C3 so that the second data D2 may be written in the memory 5.

Figure 2:
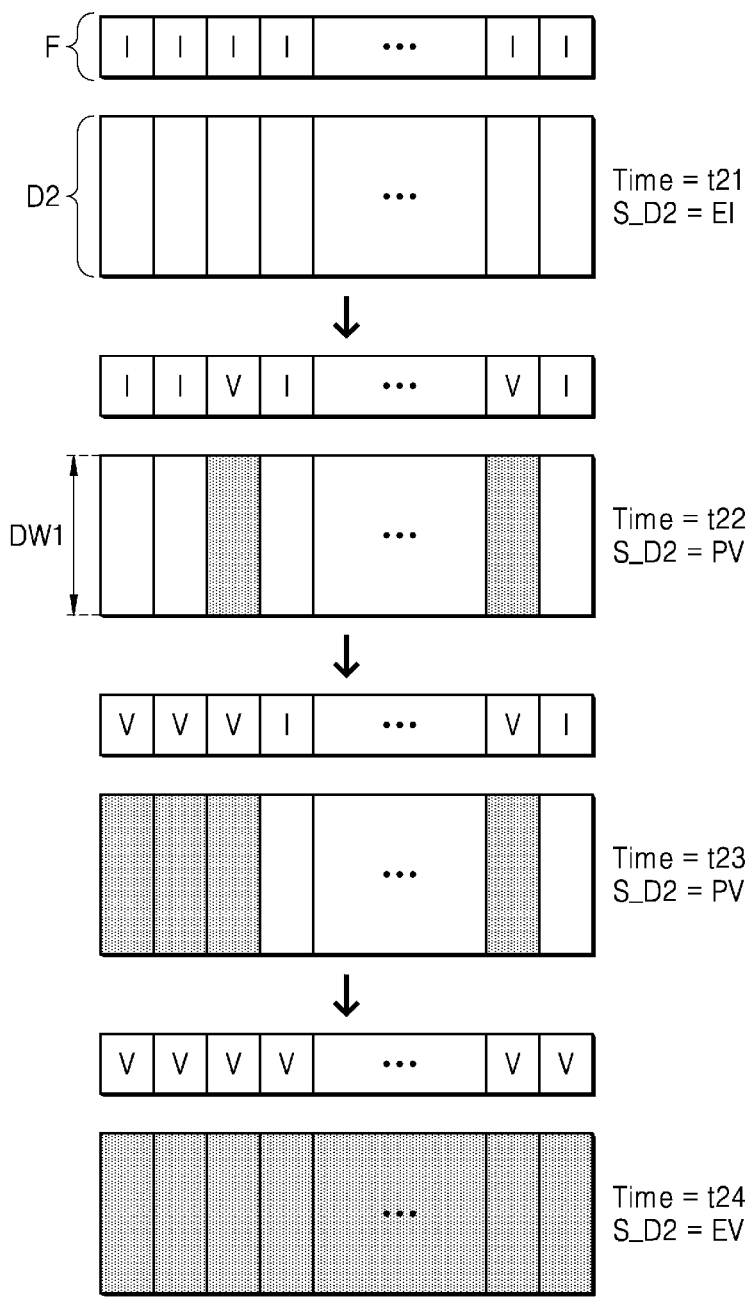
FIG. 2 is a diagram illustrating examples of a state of second data of FIG. 1 according to an exemplary embodiment of the inventive concept.

The controller 15 may instantly write the write data D_WR to the first write buffer 11 and may also write the second data D2 having the second data width DW2 of the memory 5 from the second write buffer 12 to the memory 5. Therefore, the write request W_REQ may be processed fast, and, moreover, deterioration of the memory 5 may be minimized since the number of times of writing to the memory 5 is reduced. Therefore, the lifespan of the memory 5 may be extended. The controller 15 may include a processing unit including at least one core and a software module executed by the at least one core, may include a hardware module designed by logic synthesis, or may include a combination of a processing unit and a hardware module, FIG. 2 is a diagram illustrating examples of a state of the second data D2 of FIG. 1 according to an exemplary embodiment of the inventive concept. As described above with reference to FIG. 1, the second data D2 may refer to data having the second data width DW2 and stored in the second write buffer 12. As illustrated in FIG. 2, a state S_D2 of the second data D2 may change, and the controller 15 of FIG. 1 may process the write request W_REQ based on the state SD2 of the second data D2. Hereinafter, FIG. 2 will be described in connection with FIG. 1.

The second data D2 may be partially updated with the first data D1. As illustrated in FIG. 2, the second data D2 may be divided into data having the first data width DW1, and the controller 15 may refer to a flag F including information indicating validity (V) or invalidity (I) of divided data. Herein, data updated with new data may be referred to as valid data, and non-updated data or old data corresponding to updated data may be referred to as invalid data. In exemplary embodiments of the inventive concept, the flag F may be stored in the controller 15, or may be stored in the second write buffer 12.

In exemplary embodiments of the inventive concept, the second data D2 may have one of an entirely invalid state EI, a partially valid state PV, and an entirely valid state EV. For example, as illustrated in FIG. 2, the second data D2 may include only invalid data at a time t21, and thus the second data D2 may be in the entirely invalid state EI (S_D2=EI). After the time t21, a portion of the second data D2 may be updated since the first data D1 is written to the second write buffer 12, and thus, the second data D2 may be in the partially valid state PV (S_D2=PV) at a time t22. After the time t22, another portion of the second data D2 may be updated since the first data D1 is written to the second write buffer 12. In this case, the second data D2 may still include non-updated data, and thus, the second data D2 may maintain the partially valid state PV (S_D2=PV) at a time t23. After the time t23, the second data D2 may include only valid data since the first data D1 is written to the second write buffer 12, and thus, the second data D2 may be in the entirely valid state EN (S_D2=EV) at the time t24. In exemplary embodiments of the inventive concept, when the first data D1 is written to the second write buffer 12, the flag F corresponding to the written data may be changed to indicate the validity V. Furthermore, in exemplary embodiments of the inventive concept, the controller 15 may change all the flags F into the invalidity I to set the second data D2 to the entirely invalid state EI.

Figure 3:
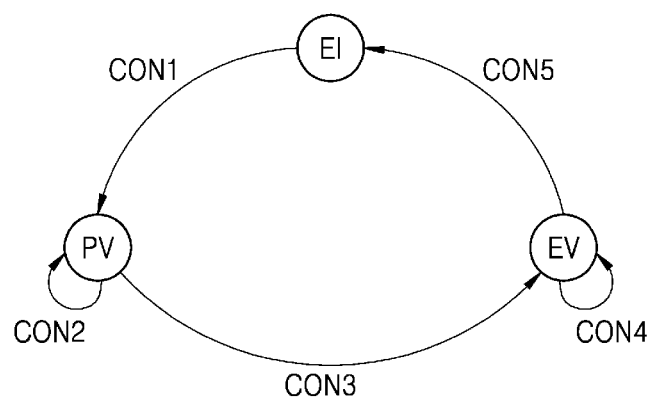
FIG. 3 is a diagram illustrating states of second data according to an exemplary embodiment of the inventive concept.

FIG. 3 is a diagram illustrating states of the second data D2 according to an exemplary embodiment of the inventive concept. As described above with reference to FIG. 2, the second data D2 may be in one state among the entirely invalid state EI, the partially valid state PV and the entirely valid state EV. Hereinafter, FIG. 3 will be described in connection with FIG. 1.

The second data D2 may be in the entirely invalid state EI in an initial state in which no write request W_REQ is received. Furthermore, the second data D2 may be set to the entirely invalid state EI by the controller 15. The second data D2 may transition from the entirely invalid state EI to the partially valid state PV when a first condition CON1 is satisfied. For example, the first condition CON1 may include a condition that the first data D1 stored in the first write buffer 11 is written to the second write buffer 12.

The second data D2 may maintain the partially valid state PV when a second condition CON2 is satisfied in the partially valid state PV. For example, the second condition CON2 may include a condition that the first data D1 is stored in the second write buffer 12 but the second data D2 still includes invalid data. Furthermore, the second data D2 may transition from the partially valid state PV to the entirely valid state EV when a third condition CON3 is satisfied. For example, the third condition CON3 may include a condition that all of the invalid data included in the second data D2 is switched to valid data since the first data D1 is written to the second write buffer 12. In other words, the third condition CON3 may occur when all of the first data D1 is finally written to the second write buffer 12.

The second data 132 may maintain the entirely valid state EV when a fourth condition CON4 is satisfied in the entirely valid state EV. For example, the fourth condition CON4 may include a condition that the first data D1 is written to the second write buffer 12. Furthermore, the second data D2 may transition from the entirely valid state EV to the entirely invalid state EI when a fifth condition CON5 is satisfied. For example, the fifth condition CON5 may include a condition that the second data D2 stored in the second write buffer 12 is written to the memory 5.

Figure 4:
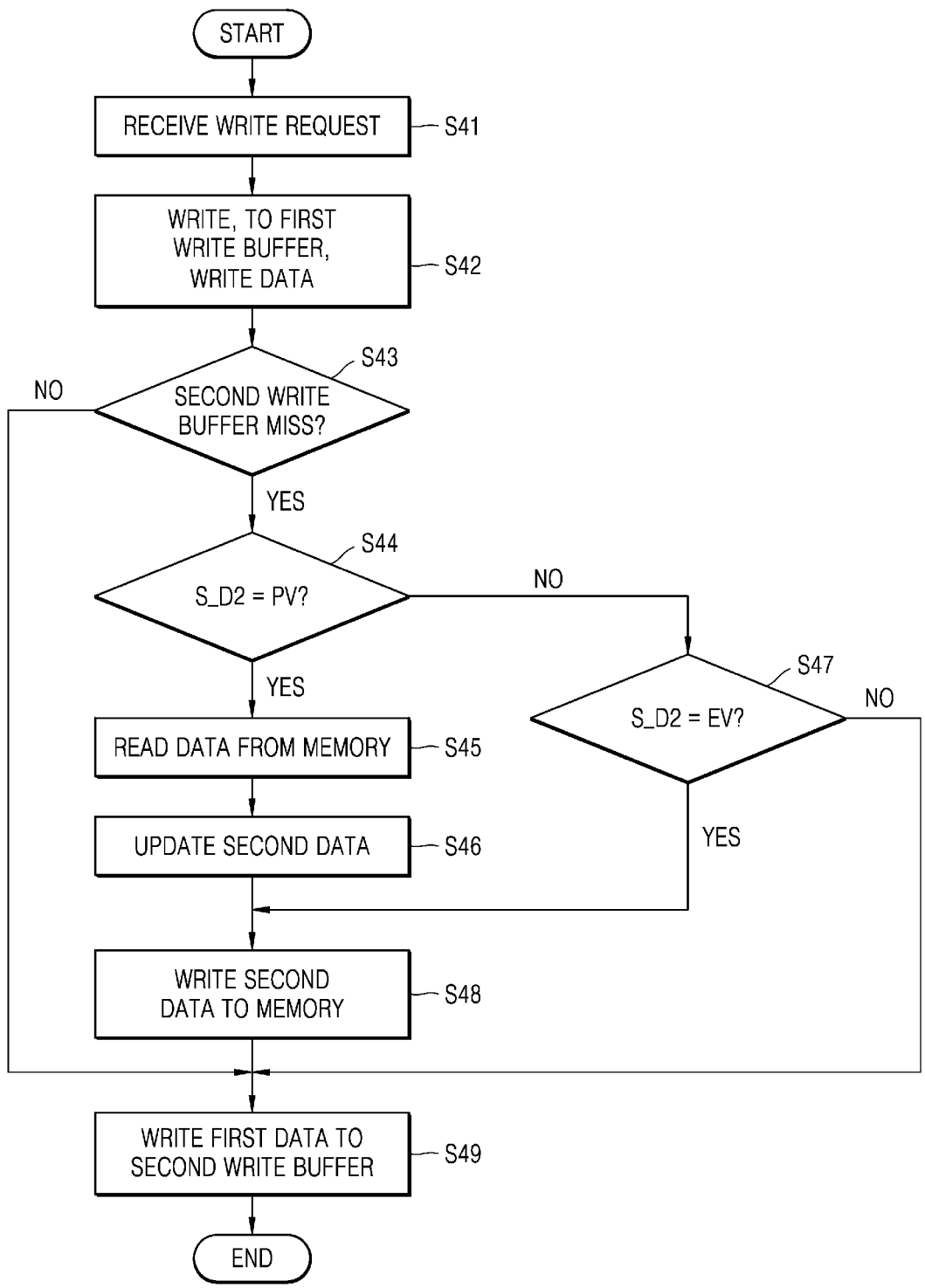
FIG. 4 is a flowchart illustrating a method of writing data, according to an exemplary embodiment of the inventive concept.

FIG. 4 is a flowchart illustrating a method of writing data, according to an exemplary embodiment of the inventive concept. In exemplary embodiments of the inventive concept, the method of writing data, illustrated in FIG. 4, may be performed by the data writing device 10 illustrated in FIG. 1. Herein, the method of writing data may be referred to as a method of processing a write request W_REQ for the memory 5 of FIG. 1 or a method of processing a write request W_REQ. As illustrated in FIG. 4, the method of writing data may include a plurality of operations S41 to S49. Hereinafter, FIG. 4 will be described in connection with FIG. 1.

In operation S41, an operation of receiving the write request W_REQ may be performed. For example, the data writing device 10 may receive the write request W_REQ including the write address A_WR, the write command C_WR, and the write data D_WR. In operation S42, an operation of writing the write data D_WR to the first write buffer 11 may be performed. For example, the controller 15 may provide, in response to the write command C_WR, the first control signal C1 to the first write buffer 11 so that the write data D_WR may be written to the first write buffer 11. Accordingly, the first write buffer 11 may store the write data D_WR included in the write request W_REQ when the write request W_REQ is received. The write data D_WR written to the first write buffer 11 may have the first data width DW1.

In operation S43, whether a miss occurs in the second write buffer 12 may be determined. The controller 15 may determine whether a miss (or hit) occurs in the second write buffer 12 based on the write address A_WR and the address of the second data D2. For example, the controller 15 may determine that a hit occurs in the second write buffer 12 when a region of the memory 5 corresponding to the write address A_WR is included in a region of the memory 5 corresponding to the address of the second data D2. Furthermore, the controller 15 may determine that a miss occurs in the second write buffer 12 when the region of the memory 5 corresponding to the write address A_WR is not included in the region of the memory 5 corresponding to the address of the second data D2. As illustrated in FIG. 4, operation S44 may be subsequently performed when it is determined that a miss occurs in the second write buffer 12, or operation S49 may be subsequently performed when it is determined that a hit occurs in the second write buffer 12.

When it is determined that a miss occurs in the second write buffer 12, it may be determined whether the state S_D2 of the second data D2 is the partially valid state PV operation S44. As illustrated in FIG. 4, operation S45 may be subsequently performed when the state S_D2 of the second data D2 is the partially valid state PV, or operation S47 may be subsequently performed when the state S_D2 of the second data D2 is the entirely invalid state EI or the entirely valid state EV. In operation S47, it may be determined whether the state S_D2 of the second data D2 is the entirely valid state EV. As illustrated in FIG. 4, operation S48 may be subsequently performed when the state S_D2 of the second data D2 is the entirely valid state EV, or operation S49 may be performed when the state S_D2 of the second data D2 is the entirely invalid state EI. Accordingly, after operation S43 is performed, when the state S_D2 of the second data D2 is the partially valid state PV, operation S45, operation S46, operation S48, and operation S49 may be sequentially performed, or, when the state S_D2 of the second data D2 is the entirely valid state EV, operation S48 and operation S49 may be sequentially performed, or, when the state S_D2 of the second data D2 is the entirely invalid state EI, operation S49 may be performed.

When, a hit occurs in the second write buffer 12, the first data D1 may be written to the second write buffer 12 in operation S49. For example, the controller 15 may write the first data D1 included in the first write buffer 11 to the second write buffer 12 regardless of the state S_D2 of the second data D2, and thus, the second data D2 stored in the second write buffer 12 may be the partially valid state PV or the entirely valid state EV.

When a miss occurs in the second write buffer 12 and the state S_D2 of the second data D2 is the partially valid state PV, data may be read from the memory 5 in operation S45. For example, the controller 15 may read data corresponding to the address of the second data D2 from the memory 5. Next, the second data D2 may be updated in operation S46. For example, the controller 15 may update the second data D2 by updating an invalid portion of the second data D2 with data read from the memory 5. Accordingly, the second data D2 may include only valid data and may have the entirely valid state EV. Next, the second data D2 may be written to the memory 5 in operation S48. For example, the controller 15 may write, to the memory 5, the second data D2, which is in the entirely valid state EV, and may set the second data D2 to the entirely invalid state IV. In operation S49, an operation of writing the first data D1 to the second write buffer 12 may be performed, and the second data D2 stored in the second write buffer 12 may have the partially valid state PV.

When a miss occurs in the second write buffer 12 and the state of the second data D2 is the entirely valid state EV, an operation of writing the second data D2 to the memory 5 may be performed in operation S48. For example, since the second data D2 is in the entirely valid state EV, the controller 15 may skip updating the second data D2 with data stored in the memory 5, may write the second data D2 to the memory 5, and may set the second data D2 to the entirely invalid state IV. Next, in operation S49, an operation of writing the first data D1 to the second write buffer 12 may be performed, and the second data D2 stored in the second write buffer 12 may have the partially valid state PV.

When a miss occurs in the second write buffer 12 and the state of the second data D2 is the entirely invalid state EI, an operation of writing the first data D1 to the second write buffer 12 may be performed in operation S49. For example, since the second data D2 is in the entirely invalid state EI, the controller 15 may skip updating; the second data D2 or writing the second data D2, and may write the first data D1 to the second write buffer 12.

Figure 5A:
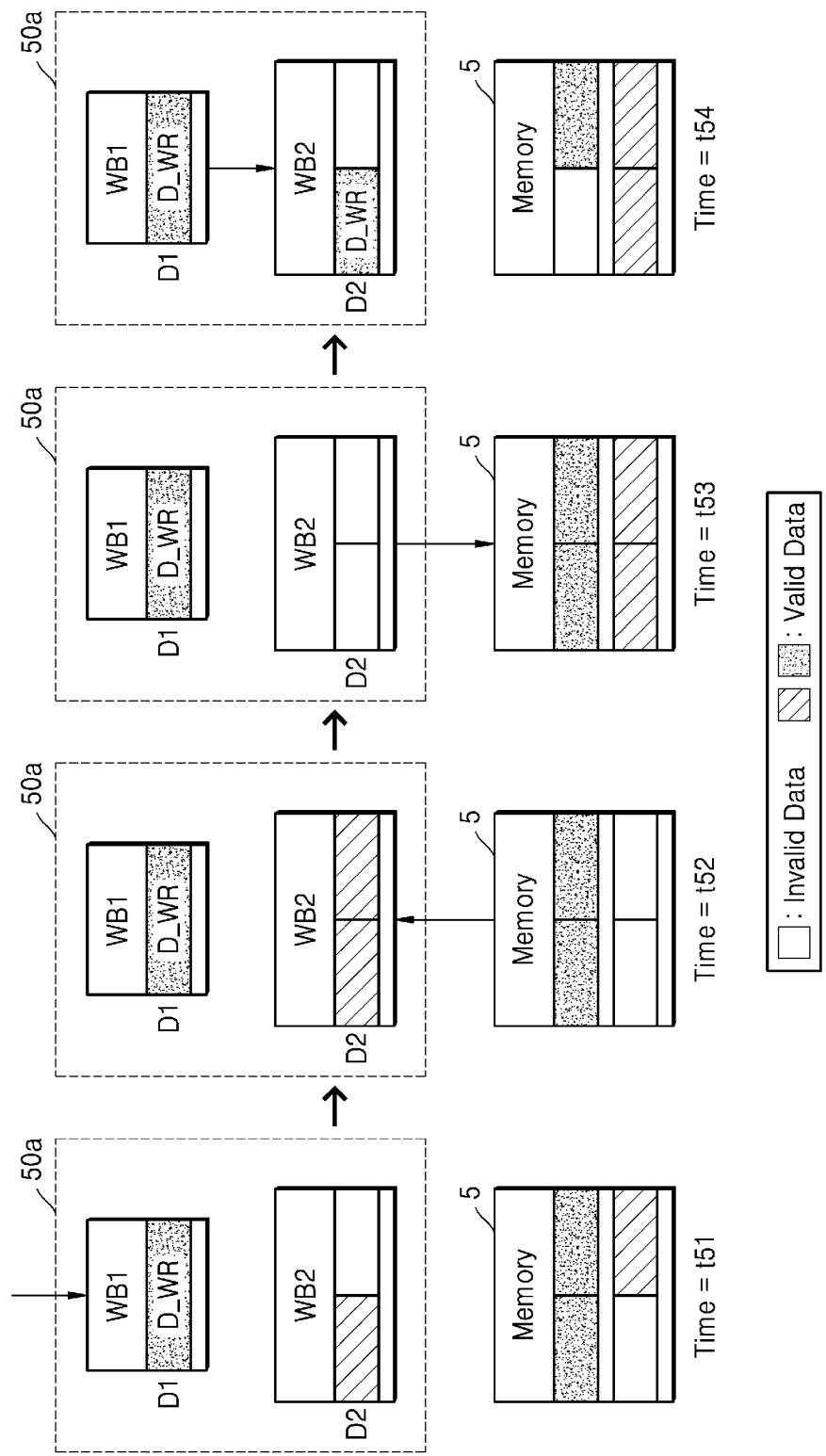
FIGS. 5A, 5B and 5C are block diagrams illustrating examples of an operation of a data writing device over time according to exemplary embodiments of the inventive concept.
Figure 5B:
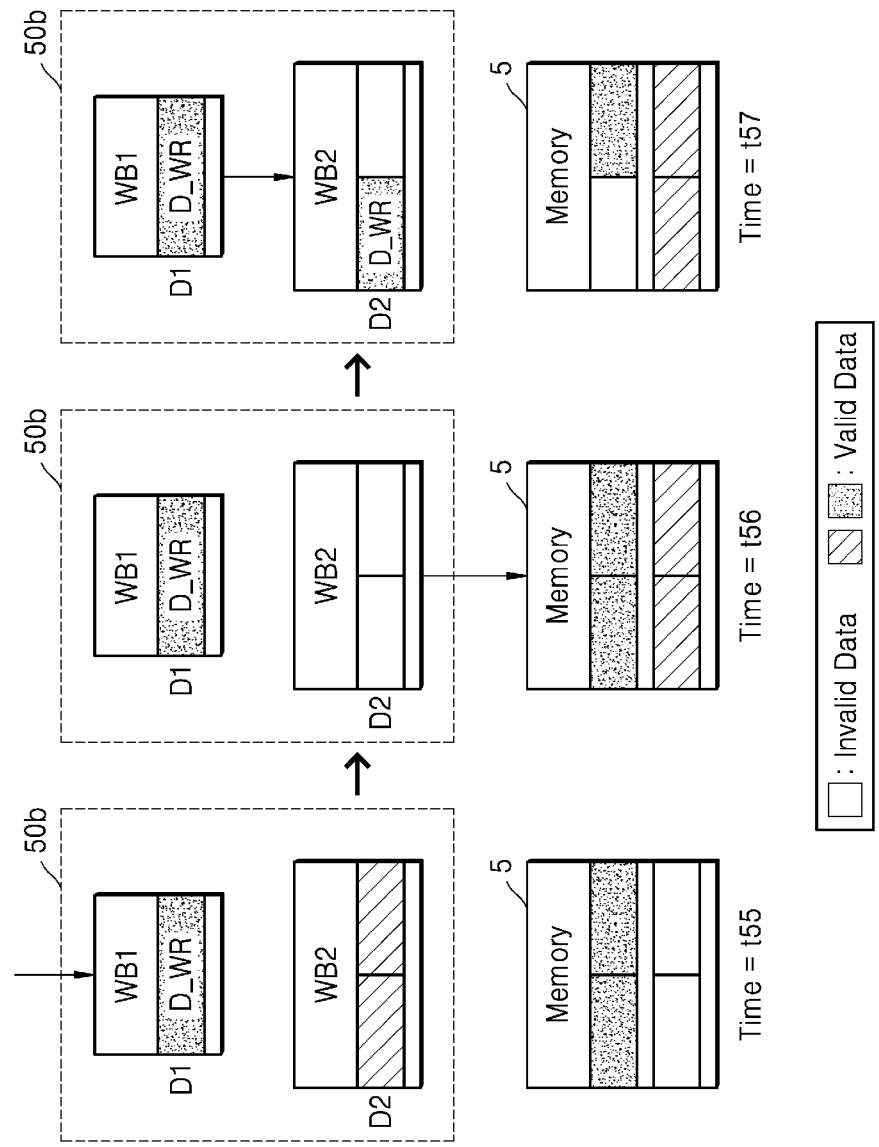
Figure 5C:
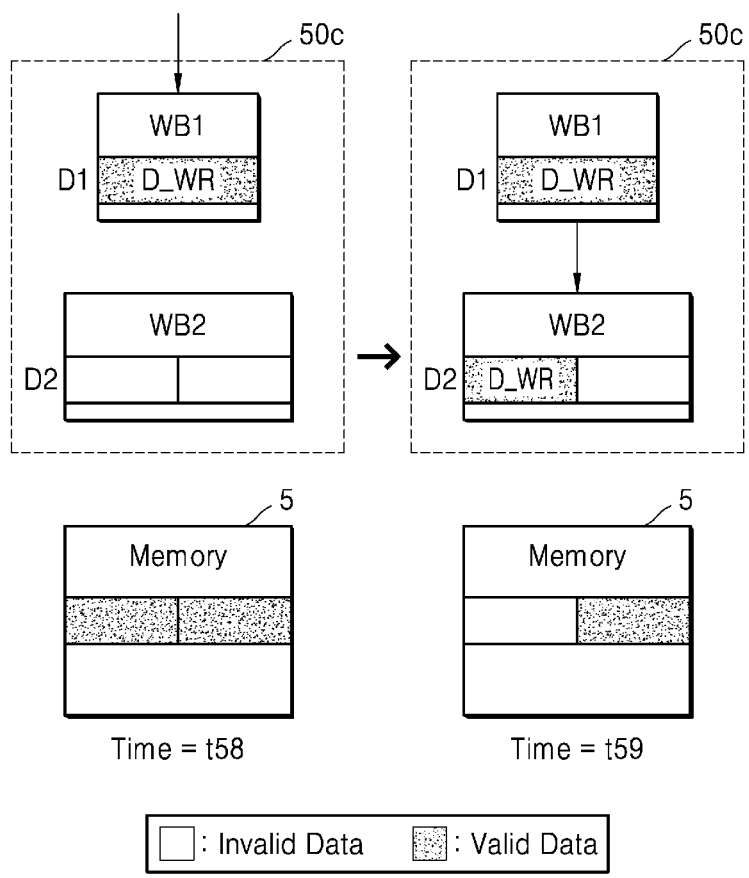

FIGS. 5A to 5C are block diagrams illustrating examples of an operation of a data writing device over time according to exemplary embodiments of the inventive concept. For example, FIG. 5A illustrates an example of an operation of a data writing device 50a when a miss occurs in a second write buffer WB2 and the state SD2 of the second data D2 is the partially valid state PV, FIG. 5B illustrates an example of an operation of a data writing device 50b when a miss occurs in the second write buffer WB2 and the state S_D2 of the second data D2 is the entirely valid state EV, and FIG. 5C illustrates an example of an operation of a data writing, device 50c when the state S_D2 of the second data D2 is the entirely invalid state IV.

Referring to FIG. 5A, at a time t51, a first write buffer WB1 may store the first data D1 matching the write data D_WR, and the second data D2 stored in a second write buffer WB2 may be in the partially valid state PV. Accordingly, the memory 5 may store partially valid data. At a time t52, the second write buffer WB2 may receive data read from a region of the memory 5 corresponding to the second data D2, and an invalid portion of the second data D2 may be updated with the read data. Accordingly, the second data D2 may be in the entirely valid state EV at the time t52. At a time t53, the second data D2 stored in the second write buffer WB2 may be written to the memory 5, and thus, the second data D2 may be in the entirely invalid state EI, and the memory 5 may store entirely valid data. In other words, at the time t53, the second write buffer WB2 may be empty. At a time t54, the first data D1 matching the write data D_WR and stored in the first write buffer WB1 may be written to the second write buffer WB2. Accordingly, the second data D2 may be in the partially valid state PV, and the memory 5 may store partially invalid data.

Referring to FIG. 5B, at a time t55, the first write buffer WB1 may store the first data D1 matching the write data D_WR, and the second data D2 stored in the second write buffer WB2 may be in the entirely valid state EV. Accordingly, the memory 5 may store entirely invalid data. At a time t56, the second data D2 stored in the second write buffer WB2 may be written to the memory 5, and thus, the second data D2 may be in the entirely invalid state EI, and the memory 5 may store entirely valid data. At a time t57, the first data D1 matching the write data D_WR and stored in the first write buffer WB1 may be written to the second write buffer WB2. Accordingly, the second data D2 may be in the partially valid state PV, and the memory 5 may store partially invalid data.

Referring to FIG. 5C, at a time t58, the first write buffer WB1 may store the first data D1 matching the write data D_WR, and the second data D2 stored in the second write buffer WB2 may be in the entirely invalid state EI. Accordingly, the memory 5 may store entirety valid data. At a time t59, the first data D1 matching the write data D_WR and stored in the first write buffer WB1 may be written to the second write buffer WB2. Accordingly, the second data D2 may be in the partially valid state PV, and the memory 5 may store partially invalid data.

FIG. 6 is a block diagram illustrating a data writing device according to an exemplary embodiment of the inventive concept. For example, FIG. 6 illustrates a data writing device 60, which not only writes data to the memory 5 but also reads data from the memory 5, e.g., processes a read request R_REQ. Similarly to the data writing device 10 of FIG. 1, the data writing device 60 may include a first write buffer 61, a second write buffer 62, and a controller 65, and may further include a read buffer 63. Hereinafter, descriptions previously given with reference to FIG. 1 will be omitted to provide descriptions related to FIG. 6.

The data writing device 60 may receive the read request R_REQ for the memory 5 and may process the read request R_REQ. The read request R_REQ may be referred to as a read message, and may include a read address A_RD and a read command C_RD as illustrated in FIG. 6. The read address A_RD may indicate a location in which read data D_RD is stored in the memory 5, and the read command C_RD may indicate that a request provided to the data writing device 60 is the read request R_REQ. Although FIG. 6 illustrates the read address A_RD and the read command C_RD as being separately received, in exemplary embodiments of the inventive concept, the data writing device 60 may extract the read address A_RD and the read command C_RD by receiving and decoding the read request R_REQ. Like the write data D_WR of FIG. 1, the read data D_RD may have the first data width DW1 and may be output from the read buffer 63.

The read buffer 63 may have the second data width DW2. The read buffer 63 may have a fast operation speed and may include, but is not limited to, a plurality of registers. As illustrated in FIG. 6, the read buffer 63 may receive a fourth control signal C4, may store, based on the fourth control signal C4, data read from the memory 5 having the second data width DW2, and may output the read data D_RD having the first data width DW1 among stored third data. D3.

The controller 65 may receive the read address A_RD and the read command C_RD included in the read request R_REQ and may further receive the write address and A_WR and the write command C_WR included in the write request W_REQ as illustrated in FIG. 1. The controller 65 may generate first to fourth control signals C1 to C4. For example, the controller 65 may generate, based on the read address A_RD and the read command C_RD, the third control signal C3 so that data may be read from the memory 5 and may generate the fourth control signal C4 so that read data may be written to the read buffer 63. Furthermore, the controller 65 may generate, based on the read address A_RD, the fourth control signal C4 so that data having the first data width DW1 among the third data D3 stored in the read buffer 63 is output as the read data D_RD.

When the write request W_REQ is received after the third data D3 is stored in the read buffer 63 due to the read request R_REQ, the controller 65 may process the write request W_REQ based on an address of the third data D3 and the write address A_WR included in the write request W_REQ. For example, the controller 65 may skip an operation of writing the third data D3 to the memory 5 before processing the write request W_REQ. Accordingly, the time required for writing the third data D3 may not be necessary, and operations of writing to the memory 5 may be reduced, and thus the lifespan of the memory 5 may be further extended.

Figure 7A:
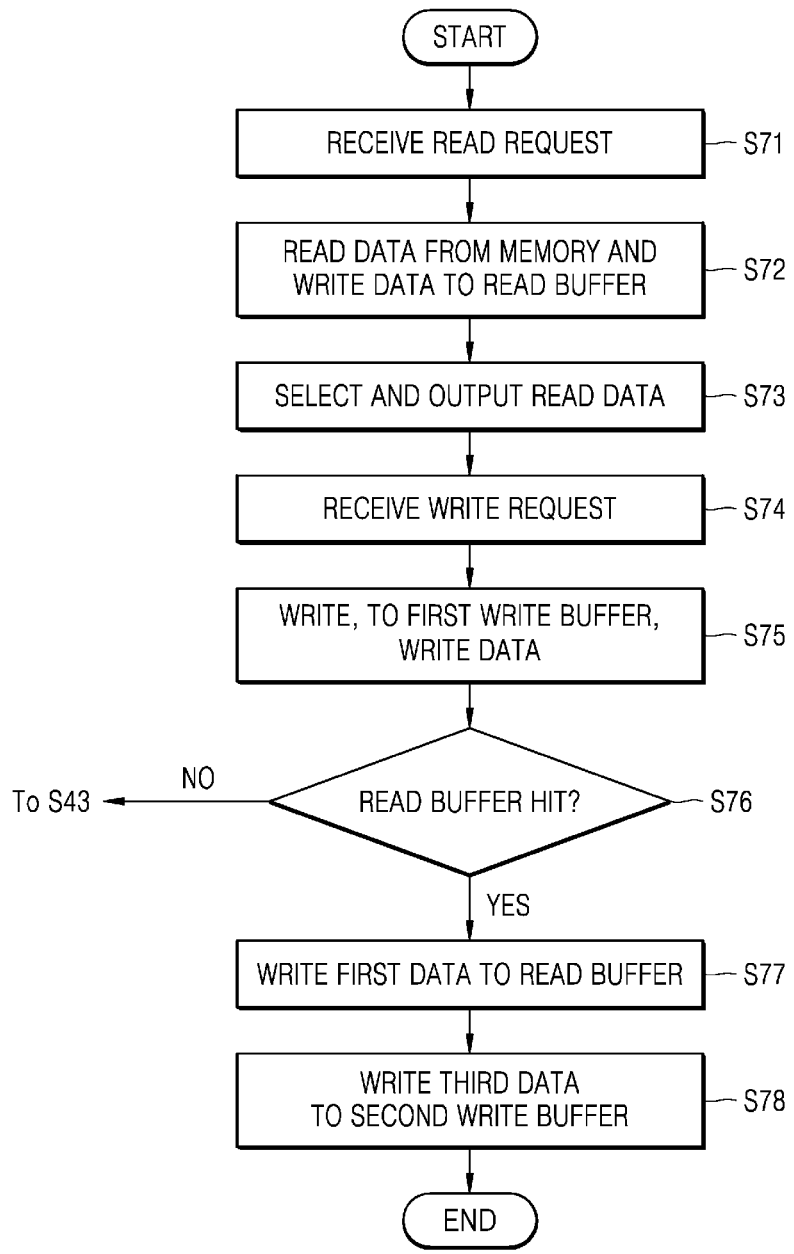
FIG. 7A is a flowchart illustrating a method of writing data, according to an exemplary embodiment of the inventive concept.
Figure 7B:
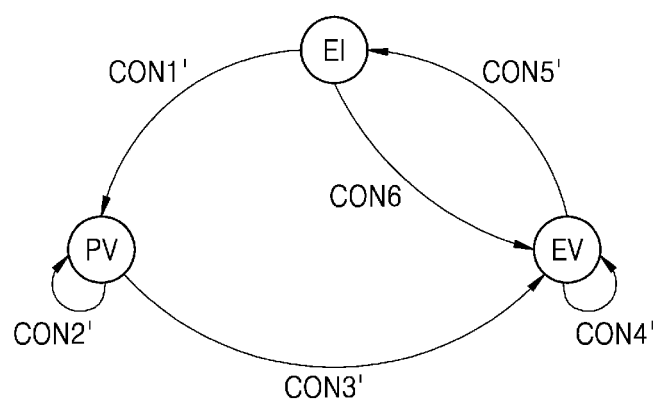
FIG. 7B is a diagram illustrating states of second data according to an exemplary embodiment of the inventive concept.

FIG. 7A is a flowchart illustrating a method of writing data, according to an exemplary embodiment of the inventive concept, and FIG. 7B is a diagram illustrating states of the second data D2 according to an exemplary embodiment of the inventive concept. In exemplary embodiments of the inventive concept, the method of writing data, illustrated in FIG. 7A, may be performed by the data writing device 60 of FIG. 6, and FIG. 7B illustrates states of the second data D2 in the data writing device 60 of FIG. 6. As illustrated in FIG. 7A, the method of writing data may include a plurality of operations S71 to S78. Hereinafter, FIGS. 7A and 7B will be described in connection with FIG. 6, and descriptions previously given with reference to FIG. 4 will be omitted to provide descriptions related to FIG. 7A, and descriptions previously given with reference to FIG. 3 will be omitted to provide descriptions related to FIG. 7B.

In operation S71, an operation of receiving the read request R_REQ may be performed. For example, the data writing device 60 may receive the read request R_REQ including the read address A_RD and the read command C_RD. For example, the controller 65 may receive the read request R_REQ. Next, in operation S72, an operation of reading data from the memory 5 and writing the data to the read buffer 63 may be performed. For example, the controller 15 may read data corresponding to the read address A_RD from the memo 5 and may write read data to the read buffer 63. Next, in operation S73, an operation of selecting and outputting the read data D_RD may be performed. For example, the controller 15 may select, based on the read address A_RD, data having the first data width DW1 from the third data D3 having the second data width DW2 and stored in the read buffer 63, and may control the read buffer 63 through the fourth control signal C4 so that the selected data may be output as the read data D_RD. The read data D_RD may be output with the first data width DW1.

In operation S74, the write request W_REQ may be received, and, in operation S75, an operation of writing the write data D_WR to the first write buffer 61 may be performed. Next, in operation S76, it may be determined whether a hit occurs in the read buffer 63. For example, the controller 65 may determine whether a hit (or miss) occurs in the read buffer 63 based on the write address A_WR and the address of the third data D3 stored in the read buffer 63. For example, in a manner similar to the determination of the occurrence of a hit in the second write buffer 62, the controller 65 may determine that a hit occurs in the read buffer 63 when a region of the memory 5 corresponding to the write address A_WR is included in a region of the memory 5 corresponding to the address of the third data D3. Furthermore, the controller 65 may determine that a miss occurs in the read buffer 63 when the region of the memory 5 corresponding to the write address A_WR is not included in the region of the memory 5 corresponding to the address of the third data D3. As illustrated in FIG. 7A, operation S77 may be subsequently performed when it is determined that a hit occurs in the read buffer 63, or operation S43 of FIG. 4 may be subsequently performed when it is determined that a miss occurs in the read buffer 63.

When it is determined that a hit occurs in the read buffer 63, an operation of writing the first data D1 to the read buffer 63 may be performed in operation S77. For example, the controller 65 may write, to the read buffer 63, the first data D1 matching the write data D_WR and stored in the first write buffer 61. Accordingly, a portion of the third data D3 may be updated with the first data D1.

In operation S78, an operation of writing the third data D3 to the second write buffer 62 may be performed. For example, the controller 65 may write the third data D3 stored in the read buffer 63 to the second write buffer 62 and may set the second data D2 matching the third data D3 and stored in the second write buffer 62 to the entirely valid state EV. Thus, an operation of writing the third data D3 stored in the read buffer 63 to the memory 5 may be skipped.

Referring to FIG. 7B, the second data D2 may be in one state among the entirely invalid state EI, the partially valid state PV, and the entirely valid state EV similarly to the data illustrated in FIG. 3. Similarly to the first to fifth conditions CON1 to CON5 illustrated in FIG. 3, first, second, third, fourth and fifth conditions CON1', CON2', CON3', CON4' and CON5' illustrated in FIG. 7B may allow the second data D2 to transition between the entirely invalid state EI, the partially valid state PV, and the entirely valid state EV. Furthermore, as illustrated in FIG. 7B, the second data D2 may transition from the entirely invalid state EI to the entirely valid state EV when a sixth condition CON6 is satisfied. For example, after it is determined that a hit occurs in the read buffer 63 in operation S76 of FIG. 7A, and the first data D1 is written to the read huller 63 in operation S77, the third data D3 may be written to the second write buffer 62 in operation S78. Accordingly, the second data D2 may transition from the entirely invalid state EI to the entirely valid state EV in operation S78, and the sixth condition CON6 may include a condition that the third data D3 is written from the read buffer 63 to the second write buffer 62.

Figure 8:
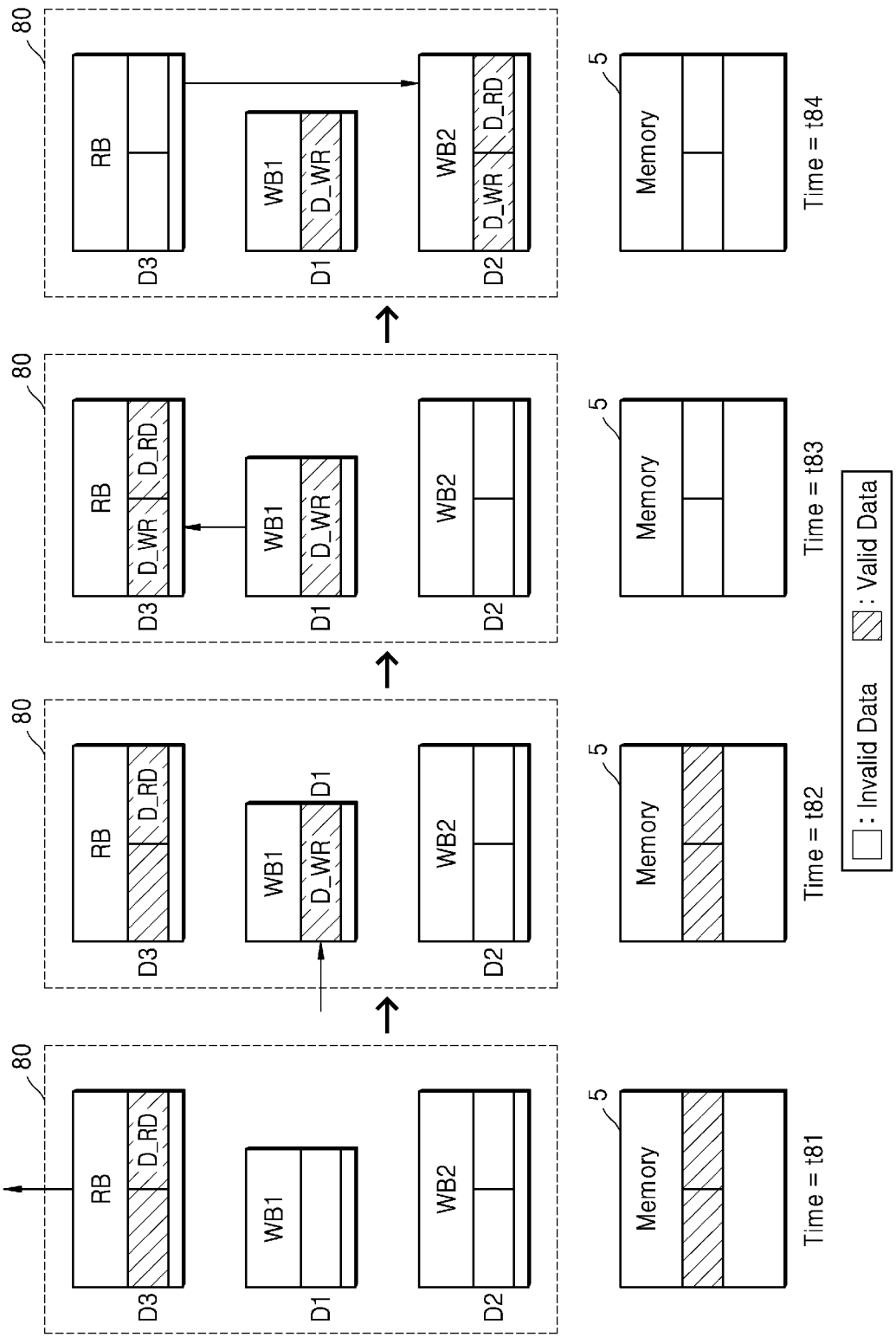
FIG. 8 is a block diagram illustrating examples of an operation of a data writing device over time according to an exemplary embodiment of the inventive concept.

FIG. 8 is a block diagram illustrating examples of an operation of a data writing device over time according to an exemplary embodiment of the inventive concept. For example, FIG. 8 illustrates an example of an operation of a data writing device 80 when a hit occurs in a read buffer RB due to the write address A_WR included in the write request W_REQ.

Referring to FIG. 8, at a time t81, data corresponding to the read address A_RD may be read from the memory 5 in response to the read request R_REQ, and the read buffer RB may store the read data D_RD. The read buffer RB may output the read data D_RD having the first data width DW1 from the stored third data D3. At a time t82, the write request W_REQ may be received, the first write buffer WB1 may store the first data D1 matching the write data D_WR, and a hit may occur in the read buffer RB due to the write address A_WR. At a time t83, the first data D1 stored in the first write buffer WB1 may be written to the read buffer RB. In this case, the read buffer RB may include the write data D_WR and the read data D_RD. In exemplary embodiments of the inventive concept, unlike the illustration of FIG. 8, data that matches the read data D_RD in the third data D3 may be overwritten by the first data D1. The read buffer RB may store the updated third data D3, and the memory 5 may include invalid data. At a time t84, the third data D3 stored in the read buffer RB may be written to the second write buffer WB2. Accordingly, the second write buffer WB2 may store the second data D2, which is in the entirely valid state EV.

Figure 9:
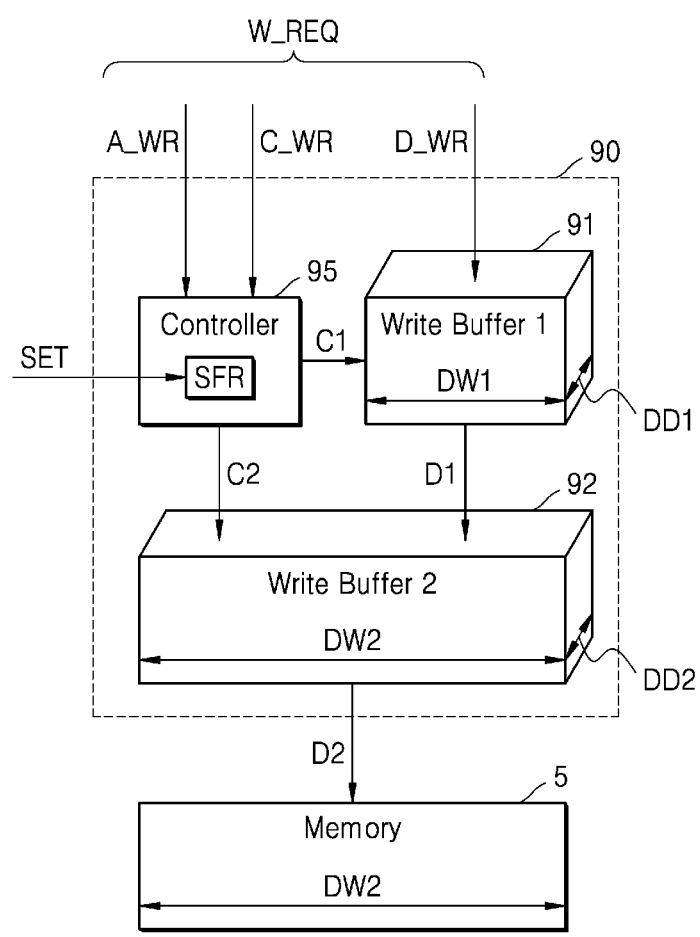
FIG. 9 is a block diagram illustrating a data writing device according to an exemplary embodiment of the inventive concept.

FIG. 9 is a block diagram illustrating a data writing device according to an exemplary embodiment of the inventive concept. For example, FIG. 9 illustrates a data writing device 90 including a controller 95 that includes a special function register SFR. Similarly to the data writing device 10 of FIG. 1, the data writing device 90 may include a first write buffer 91, a second write buffer 92, and the controller 95 and may process a write request for the memory 5. Hereinafter, descriptions previously given with reference to FIG. 1 will be omitted to provide descriptions related to FIG. 9.

The controller 95 may include the special function register SFR. The special function register SFR may be accessible from the outside of the data writing device 90 and may receive and store setting information SET for setting an operation of the controller 95. The controller 95 may process the write request W_REQ based on information stored in the special function register SFR.

In exemplary embodiments of the inventive concept, the first write buffer 91 and/or the second write buffer 92 may be reconfigurable, and the controller 95 may set a first depth DD1 of the first write buffer 91 and a second depth DD2 of the second write buffer 92 based on the setting information SET stored in the special function register SFR. For example, the first depth DD1 of the first write buffer 91 and the second depth DD2 of the second write buffer 92 may be set in response to the first control signal C1. As described above with reference to FIG. 1, the first write buffer 91 may have the first data width DW1 and may have the first depth DD1 adjustable by the controller 95. A capacity of the first write butler 91 may be determined by the lust data width DW1 and the first depth DD1, and thus, the capacity of the reconfigurable first write buffer 91 may be determined by the controller 95. Likewise, the second write buffer 92 may have the second data width DW2, and may have the second depth DD2 adjustable by the controller 95. A capacity of the second write buffer 92 may be determined by the second data width DW2 and the second depth DD2, and thus, the capacity of the reconfigurable second write buffer 92 may be determined by the controller 95. Furthermore, in exemplary embodiments of the inventive concept, the controller 95 may set not only the first depth DD1 and the second depth DD2 but also the first data width DW1 and/or the second data width DW2 based on the setting information SET.

In exemplary embodiments of the inventive concept, the controller 95 may repeatedly write the second data D2 to the memory 5 based on the setting information SET stored in the special function register SFR. For example, in order to store the second data D2, the memory 5 may request repeated writing of the second data D2 due to a structure of the memory 5. The setting information SET may include information about the number of write repeats, and the controller 95 may repeat writing of the second data D2 to the memory 5 by the number of times included in the setting information SET.

Figure 10A:
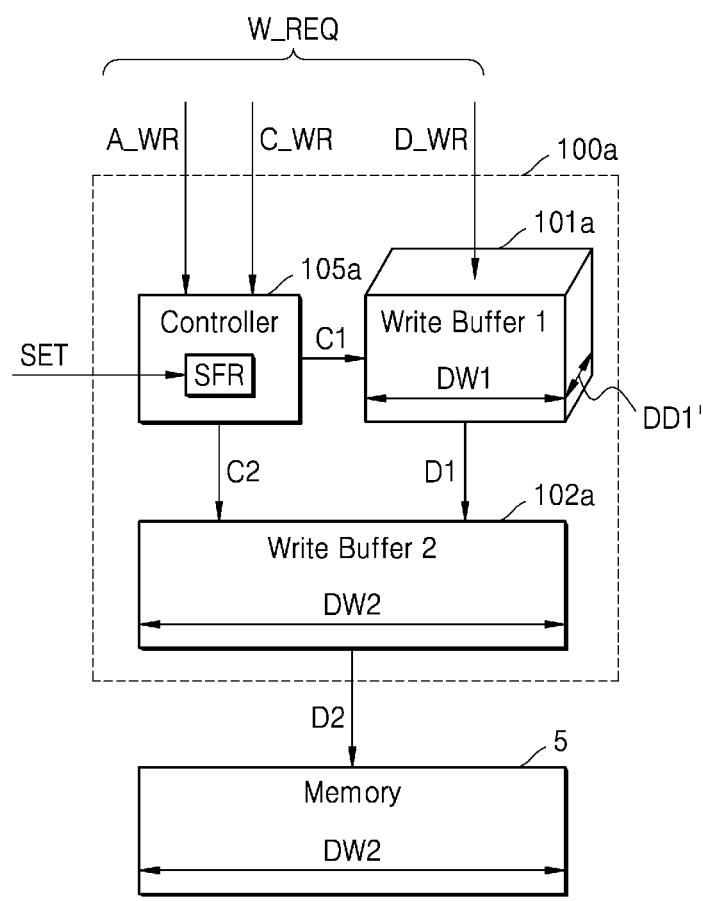
FIGS. 10A and 10B are block diagrams illustrating examples of a data writing device according to exemplary embodiments of the inventive concept.
Figure 10B:
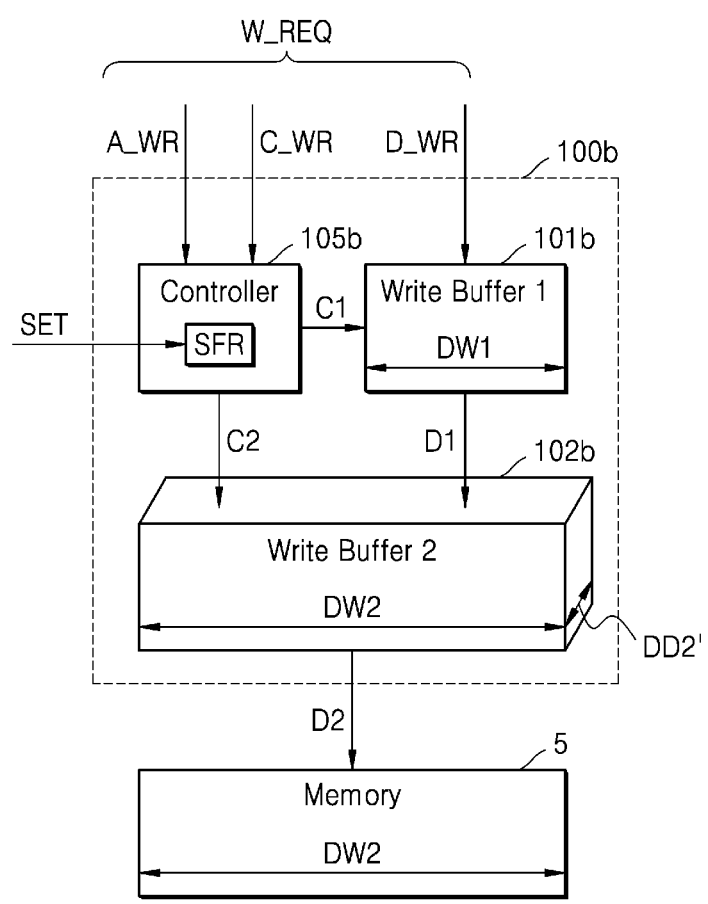

FIGS. 10A and 10B are block diagrams illustrating examples of a data writing device according to exemplary embodiments of the inventive concept. For example, FIGS. 10A and 10B illustrate examples of a data writing device including a reconfigurable first writing buffer and second writing buffer. Hereinafter, descriptions previously given with reference to FIG. 9 and overlapping descriptions related to FIGS. 10A and 10B will be omitted.

Referring to FIG. 10A, a data writing device 100a may include a first write buffer 101a, a second write buffer 102a, and a controller 105a, wherein the controller 105a may include a special function register SFR. In exemplary embodiments of the inventive concept, the controller 105a may set, based on the setting information SET, a first depth DD1' of the first write buffer 101a to be greater than that of the second write buffer 102a, as illustrated in FIG. 10A. For example, when an operation speed of the memory 5 is slower than that of a device or bus to which the data writing device 100a is connected, e.g., when an access time of the memory 5 is longer than a clock period of the device or bus to which the data writing device 100a is connected, the first depth DD1' of the first write buffer 101a may be set to be greater than the depth of the second write buffer 102a to prevent a write throughput from being reduced. Furthermore, when an integrated circuit including the data writing device 100a has a margin for the write throughput but is limited in terms of area, the first depth DD1' of the first write buffer 101a may be set to be greater than the depth of the second write buffer 102a. In other words, the first depth DD1' of the first write buffer 101a may be increased. In exemplary embodiments of the inventive concept, the first write buffer 101a and the second write buffer 102a may not be reconfigurable, and the first depth DD1' may be determined when manufacturing the data writing device 100a.

Referring to FIG. 10B, a data writing device 100b may include a first write buffer 101b, a second write buffer 102b, and a controller 105b wherein the controller 105b may include a special function register SFR. In exemplary embodiments of the inventive concept, the controller 105b may set, based on the setting information SET, a second depth DD2' of the second write buffer 102b to be greater than that of the first write buffer 101b as illustrated in FIG. 10B. For example, when the memory 5 has a lifespan sensitive to the number of times it is written, the second depth DD2' of the second write buffer 102b may be set greater than the depth of the first write buffer 101b to reduce deterioration of the memory 5 due to the number of wiring films, and thus, extend the lifespan of the memory 5. In exemplary embodiments of the inventive concept, the first write buffer 101b and the second write buffer 102b may not be reconfigurable, and the second depth DD2' may be determined when manufacturing the data writing device 100b.

Figure 11:
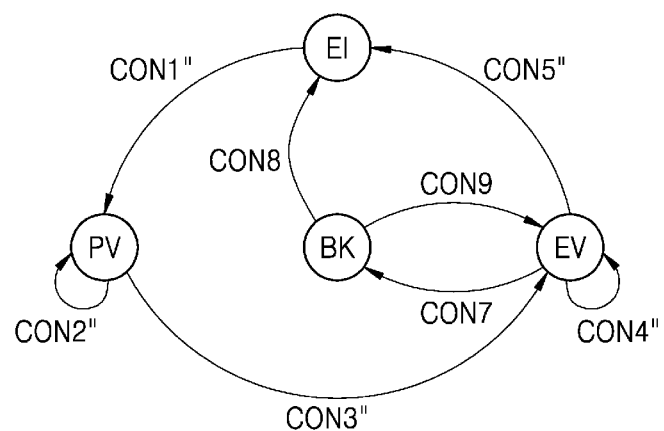
FIG. 11 is a diagram illustrating states of second data according to an exemplary embodiment of the inventive concept.

FIG. 11 is a diagram illustrating states of second data according to an exemplary embodiment of the inventive concept. The second data D2 may be in one state among the entirely invalid state EI, the partially valid state PV, the entirely valid state EV, and a backup state BK similarly to the data illustrated in FIG. 3. Hereinafter, FIG. 11 will be described in connection with FIG. 1, and descriptions previously given with reference to FIG. 3 will be omitted to provide descriptions related to FIG. 11.

Similarly to the first to fifth conditions CON1 to CON5 illustrated in FIG. 3, first, second, third, fourth and fifth conditions CON1", CON2", CON3", CON4" and CON5" illustrated in FIG. 11 may allow the second data D2 to transition between the entirely invalid state EI, the partially valid state PV, and the entirely valid state EV. The second data D2 may transition from the entirely valid state EV to the backup state BK when a seventh condition CON7 is satisfied. In exemplary embodiments of the inventive concept, the data writing device 10 may enter an idle mode. When entering the idle mode, the controller 15 may store, in the memory 5, the second data D2 stored in the second write buffer 12 and may set the second data D2 to the backup state BK. Accordingly, the seventh condition CON7 may include a condition that the second data D2 is written to the memory 5 in the idle mode.

The second data D2 may transition from the backup state BK to the entirely invalid state EI when an eighth condition CON8 is satisfied. For example, the eighth condition CON8 may include a condition that the idle mode is released and a miss occurs in the second write buffer 12 due to the write address A_WR included in the received write request W_REQ. Furthermore, the second data D2 may transition from the backup state BK to the entirely valid state EV when a ninth condition CON9 is satisfied. For example, the ninth condition CON9 may include a condition that the idle mode is released and a hit occurs in the second write buffer 12 due to the write address A_WR included in the received write request W_REQ.

Figure 12:
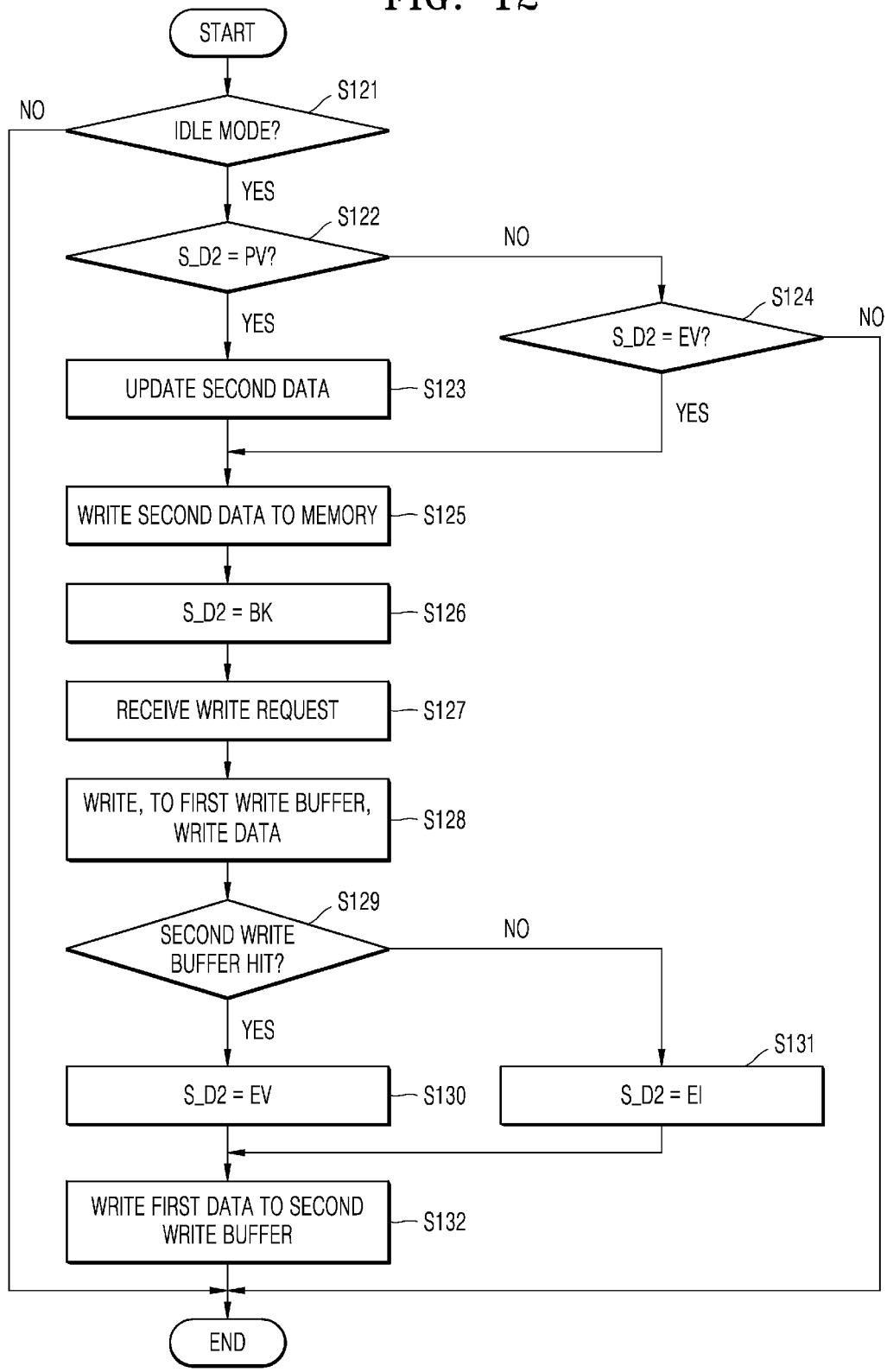
FIG. 12 is a flowchart illustrating a method of writing data, according to an exemplary embodiment of the inventive concept.

FIG. 12 is a flowchart illustrating a method of writing data, according to an exemplary embodiment of the inventive concept. For example, FIG. 12 illustrates a method of writing data when the second data D2 may have the backup state BK. In exemplary embodiments of the inventive concept, the method of writing data, illustrated in FIG. 12, may be performed by the data writing device 10 illustrated in FIG. 1. As illustrated in FIG. 12, the method of writing data may include a plurality of operations S121 to S132. Hereinafter, FIG. 12 will be described in connection with FIG. 1, and descriptions previously given with reference to FIGS. 4 and 7A will be omitted to provide descriptions related to FIG. 12.

In operation S121, whether to enter the idle mode may be determined. For example, when the write request W_REQ and/or the read request R_REQ are not received for a predefined time or when a signal for instructing to enter the idle mode in order to reduce power consumption is received externally, the controller 15 may enter the idle mode. As illustrated in FIG. 12, operation S122 may be performed when the idle mode is entered, or the method of FIG. 12 may be ended and then, for example, the method of FIG. 4 or 7A may be performed when the idle mode is not entered.

When the idle mode is entered, in operation S122, it may be determined whether the state S_D2 of the second data D2 is the partially valid state PV. As illustrated in FIG. 12, operation S123 may be subsequently performed when the state S_D2 of the second data D2 is the partially valid state PV, or operation S124 may be subsequently performed when the state S_D2 of the second data D2 is the entirely invalid state EI or the entirely valid state EV. In operation S124, it may be determined whether the state S_D2 of the second data D2 is the entirely valid state EV. As illustrated in FIG. 12, operation S125 may be subsequently performed when the state S_D2 is the entirely valid state EV, or the method of FIG. 12 may be ended when the state S_D2 of the second data D2 is the entirely invalid state EI.

When the second data D2 is in the partially valid state PV, an operation of updating the second data D2 may be performed in operation S123. For example, the controller 15 may read data corresponding to the address of the second data D2 from the memory 5 and may write a portion of the read data to the second write buffer 12 to update invalid data included in the second data D2 with valid data. Next, an operation of writing the second data D2 to the memory 5 may be performed in operation S125. For example, the controller 15 may write the updated second data D2 to the memory 5, and thus, the second data D2 stored in the second write buffer 12 may be backed up in the memory 5. Accordingly, in subsequent operation S126, an operation of setting the state of the second data D2 to the backup state BK may be performed. Moreover, when the second data D2 is in the entirely valid state EV in operation S124, operation S123 for updating the second data D2 may be skipped and operation S125 and operation S126 may be performed as illustrated in FIG. 12.

An operation of receiving the write request W_REQ may be performed in operation S127, and an operation of writing the write data D_WR to the first write buffer 11 may be performed in operation S128. Next, in operation S129, it may be determined whether a hit occurs in the second write butler 12. For example, the controller 15 may determine that a hit occurs in the second write buffer 12 when a region of the memory 5 corresponding to the address of the second data D2 stored in the second write buffer 12, e.g., the second data D2 backed up in operation S125, includes a region of the memory 5 corresponding to the write address A_WR included in the write request W_REQ. Otherwise the controller 15 may determine that a miss occurs in the second write buffer 12. As illustrated in FIG. 12, operation S130 may be subsequently performed when it is determined that a hit occurs in the second write buffer 12, or operation S131 may be subsequently performed when it is determined that a miss occurs in the second write buffer 12.

When it is determined that a hit occurs in the second write buffer 12, an operation of setting the state S_D2 of the second data D2 to the entirely valid state EV may be performed in operation S130. For example, since the second data D2, which is in the backup state BK, matches data stored in the memory 5, the controller 15 may set the state S_D2 of the second data D2 to the entirely valid state EV when a hit occurs in the second write buffer 12. Furthermore, when it is determined that a miss occurs in the second write buffer 12, an operation of setting the state S_D2 of the second data D2 to the entirely invalid state EI may be performed in operation S131. For example, when a miss occurs in the second write buffer 12, the controller 15 may set the state S_D2 of the second data D2 to the entirely invalid state EI to invalidate data included in the second data D2.

In operation S132, an operation of writing the first data D1 to the second write buffer 12 may be performed. Accordingly, as described above with reference to FIGS. 3 and 11, the second data D2 may maintain the entirely valid state EV when operation S132 is subsequently performed after operation S130, or the second data D2 may transition to the partially valid state PV when operation S132 is subsequently performed after operation S131.

Figure 13A:
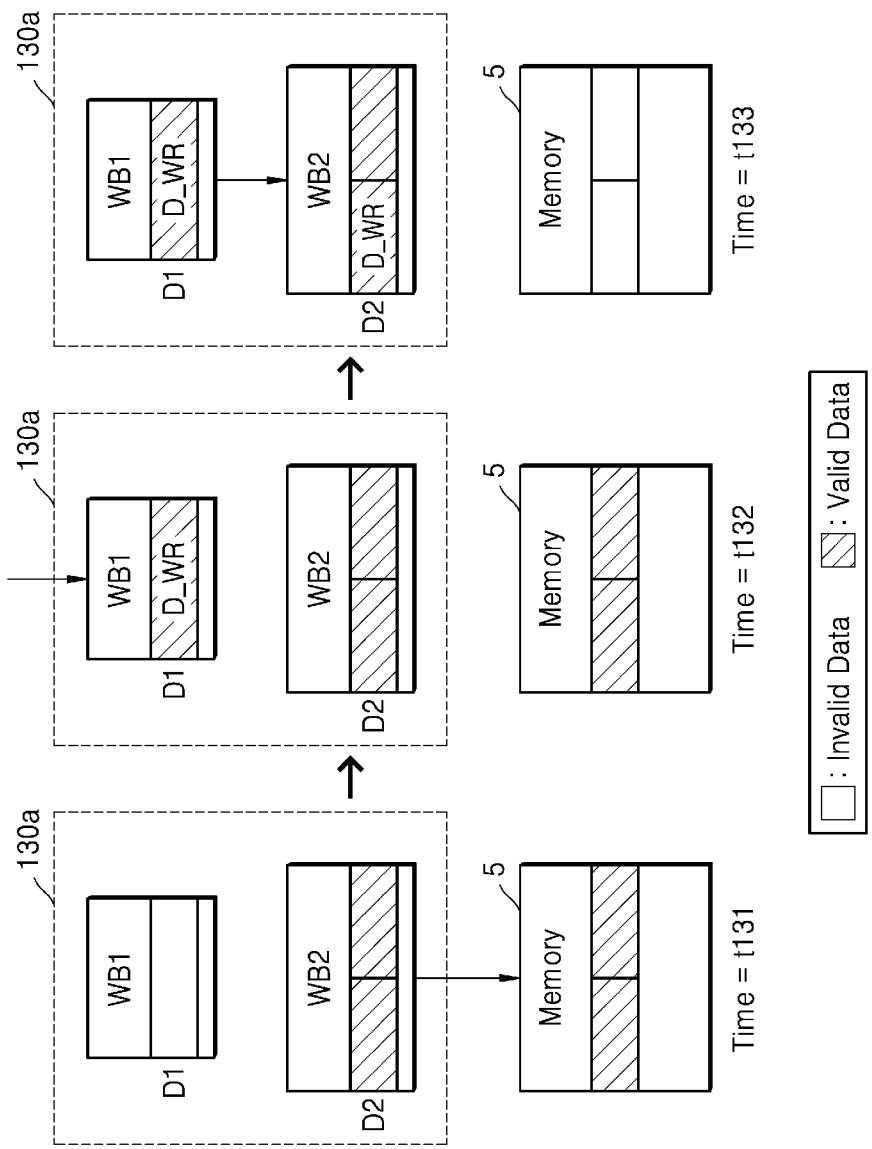
FIGS. 13A and 13B are block diagrams illustrating examples of an operation of a data writing device over time according to exemplary embodiments of the inventive concept.
Figure 13B:
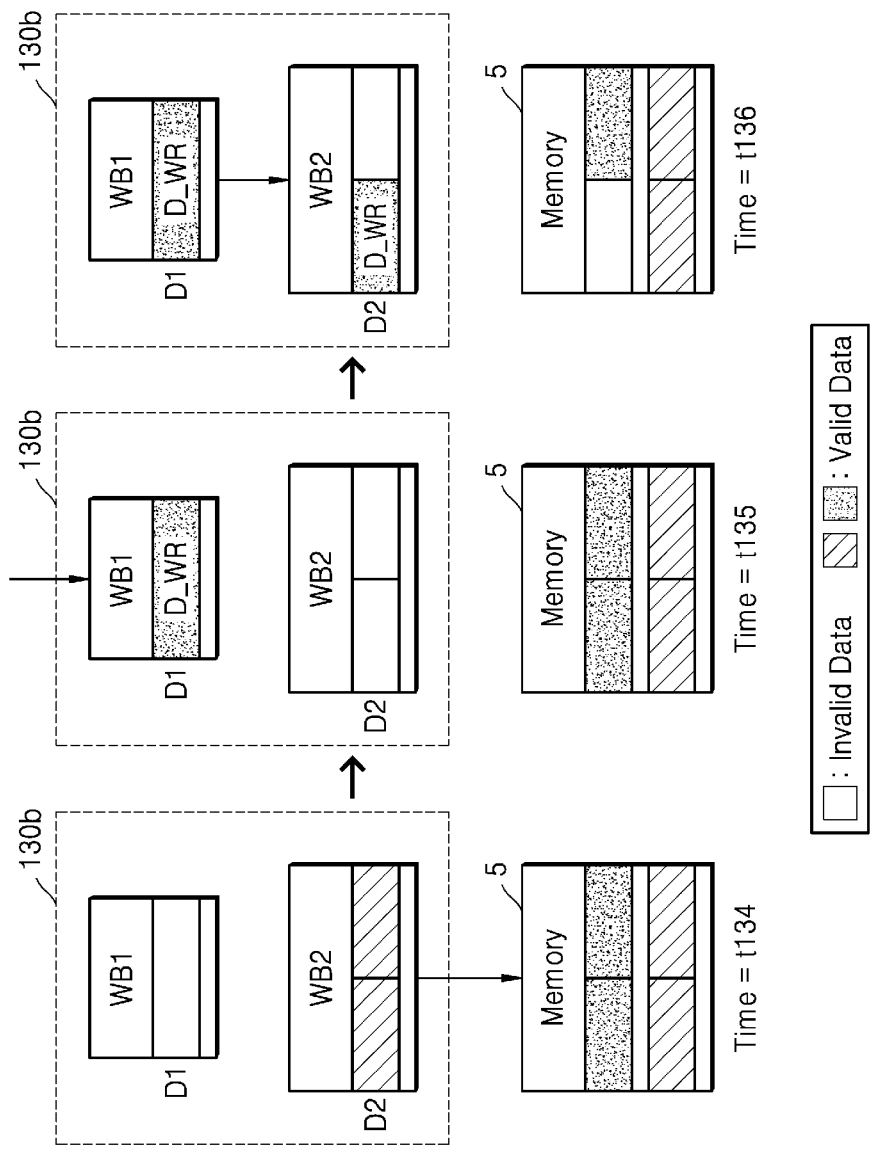

FIGS. 13A and 13B are block diagrams illustrating examples of an operation of a data writing device over time according to exemplary embodiments of the inventive concept. For example, FIG. 13A illustrates an example of operation of a data writing device 130*a* when a hit occurs in the second write buffer 12 after the idle mode is released, and FIG. 13B illustrates an example of operation of a data writing device 130*b* when a miss occurs in the second write buffer 12 after the idle mode is released.

Referring to FIG. 13A, at a time t131, the second data D2 stored in the second write buffer WB2 may be written to the memory 5 due to entrance to the idle mode. Accordingly, the same data, e.g., the second data D2, may be stored in both the second write buffer WB2 and the memory 5, and the second data D2 may be set to the backup state BK. At a time t132, the write data D_WR may be received after the idle mode is released, and thus, the first write buffer WB1 may store the first data D1 matching the write data D_WR. Furthermore, a hit may occur in the second write buffer WB2 due to the write address A_WR received together with the write data D_WR. At a time t133, the first data D1 stored in the first write buffer WB1 may be written to the second write buffer WB2. Accordingly, the second data D2 may be set to the entirely valid state EV, and the memory 5 may store invalid data.

Referring to FIG. 13B, at a time t134, the second data D2 stored in the second write buffer WB2 may be written to the memory 5 due to entrance to the idle mode. Accordingly, the second data D2 may be set to the backup state BK. At a time t135, the write data D_WR may be received after the idle mode is released, and thus, the first write buffer WB1 may store the first data D1 matching the write data D_WR. Furthermore, a miss may occur in the second write buffer WB2 due to the write address A_WR received together with the write data D_WR, and, accordingly, the second data D2 may be set to the entirely invalid state EI. At a time t136, the first data D1 stored in the first write buffer WB1 may be written to the second write buffer WB2. Accordingly, the second data D2 may be in the partially valid state PV, and the memory 5 may store partially valid data.

Figure 14:
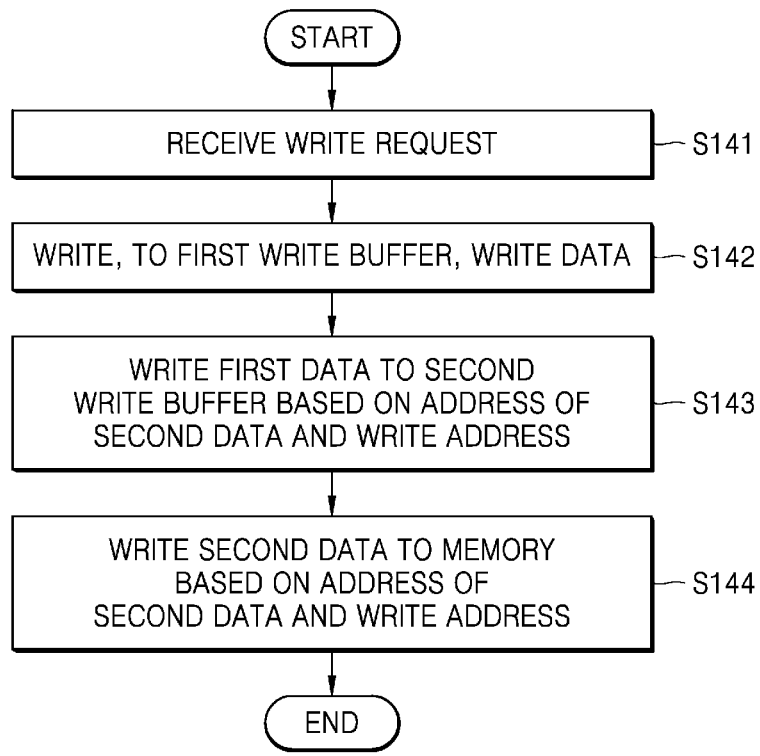
FIG. 14 is a flowchart illustrating a method of writing data, according to an exemplary embodiment of the inventive concept.

FIG. 14 is a flowchart illustrating a method of writing data, according to an exemplary embodiment of the inventive concept. In exemplary embodiments of the inventive concept, the method of FIG. 14 may be performed by the data writing, device 10 illustrated in FIG. 1. As illustrated in FIG. 14, the method of FIG. 14 may include a plurality of operations S141 to S144, and FIG. 14 will be described in connection with FIG. 1.

In operation S141, an operation of receiving the write request W_REQ may be performed. As described above with reference to FIG. 1, the write request W_REQ may include the write address A_WR, the write command C_WR, and the write data D_WR.

In operation S142, an operation of writing the write data D_WR to the first write buffer 11 may be performed. For example, the controller 15 may write the write data D_WR to the first write buffer 11 regardless of the write address A_WR.

In operation S143, an operation of writing the first data D1 to the second write buffer 12 may be performed based on the address of the second data D2 and the write address A_WR. For example, the controller 15 may determine whether a hit occurs in the second write buffer 12 based on the address of the second data D2 stored in the second write buffer 12 and the write address A_WR, and may write the first data D1 to the second write buffer 12 when it is determined that a bit occurs in the second write buffer 12.

In operation S144, an operation of writing the second data D2 to the memory 5 may be performed based on the address of the second data D2 and the write address A_WR. For example, the controller 15 may determine whether a miss occurs in the second write buffer 12 based on the address of the second data D2 stored in the second write buffer 12 and the write address A_WR, may update the second data D2 with data stored in the memory 5 when it is determined that a miss occurs in the second write buffer 12, and may write the first data D1 to the second write buffer 12 after writing the updated second data D2 to the memory 5.

Figure 15:
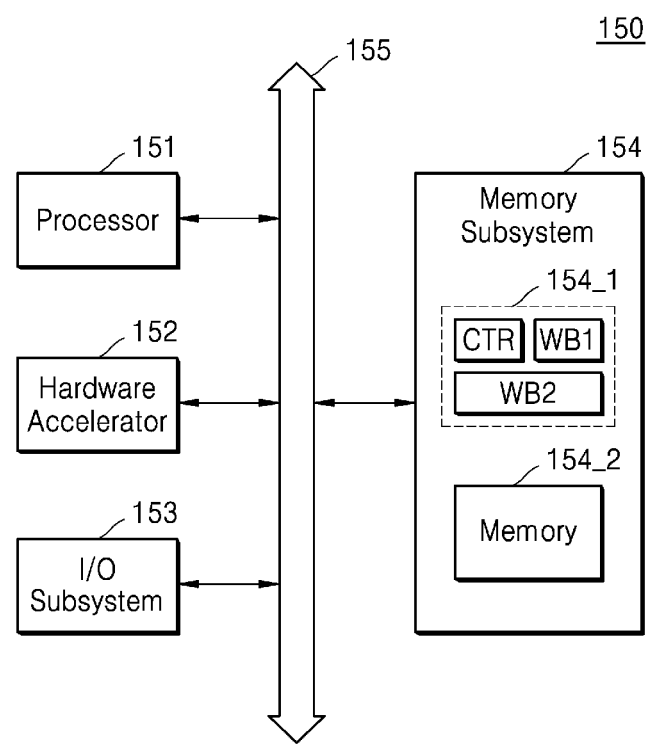
FIG. 15 is a block diagram illustrating a system including a data writing device according to an exemplary embodiment of the inventive concept.

FIG. 15 is a block diagram illustrating a system 150 including a data writing device according to an exemplary embodiment of the inventive concept. In exemplary embodiments of the inventive concept, the system 150 may be a single chip manufactured by a semiconductor process, and may be referred to as a system-on-chip (SoC). In exemplary embodiments of the inventive concept, a memory 154_2 included in a memory subsystem 154 may be referred to as an embedded memory, and may also be referred to as an embedded magnetic random access memory (eMRAM) when the memory 154_2 includes an MRAM. As illustrated in FIG. 15, the system 150 may include a processor 151, a hardware accelerator 152, an input/output subsystem 153, the memory subsystem 154, and a bus 155. The processor 151, the hardware accelerator 152, the input/output subsystem 153, and the memory subsystem 154 may communicate with each other via the bus 155.

The processor 151 may include at least one core capable of executing instructions, and may include at least one cache. In exemplary embodiments of the inventive concept, the at least one core may execute instructions obtained from the memory subsystem 154, may process data stored in the memory subsystem 154, and may generate and store data in the memory subsystem 154. To accomplish this, the processor 151 may provide a read request, a write request, and the like to the memory subsystem 154 via the bus 155.

The hardware accelerator 152 may perform a predefined function at high speed. For example, the hardware accelerator 152 may encode/decode data stored in the memory subsystem 154. To process data stored in the memory subsystem 154 and store the processed data in the memory subsystem 154, the hardware accelerator 152 may provide a read request, a write request, and the like to the memory subsystem 154 via the bus 155.

The input/output subsystem 153 may establish a communication channel to a device outside the system 150. For example, the input/output subsystem 153 may establish a serial communication channel such as universal serial bus (USB), and may also establish a communication channel for connecting to a network. The input/output subsystem 153 may transmit data stored in the memory subsystem 154 to the outside via a communication channel, and may store, in the memory subsystem 154, data received via the communication channel. To accomplish this, the input/output subsystem 153 may provide a read request, a write request, and the like to the memory subsystem 154 via the bus 155.

The memory subsystem 154 may include a data writing device 154_1 including a controller CTR, the first write buffer WB1, and the second write buffer WB2, and may include the memory 154_2. The data writing device 154_1 may receive a write request and a read request according to specifications of the bus 155. For example, the bus 155 may be based on an advanced microcontroller bus architecture (AMBA), and the memory subsystem 154 may receive a write request and a read request from the bus 155 according to an advanced high performance bus (AHB), and may transfer read data to the bus 155 according to the AHB in response to the read request. As described above with reference to exemplary embodiments of the inventive concept, the data writing device 154_1 may efficiently process a write request provided to the memory subsystem 154, thereby improving performance of the system 150. Furthermore, the data writing device 154_1 may extend the lifespan of the system 150 by reducing the number of times of writing to the memory 154_2.

Figure 16:
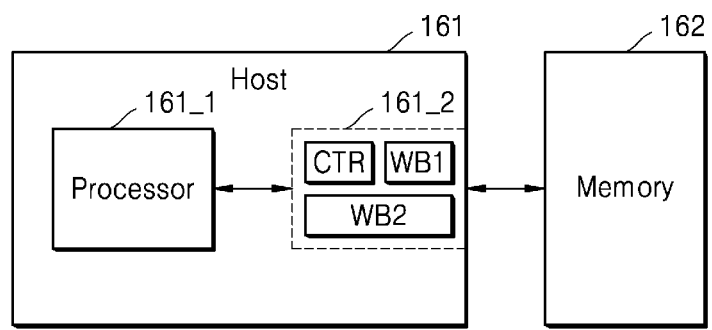
FIG. 16 is a block diagram illustrating a host including a data writing device and a memory according to an exemplary embodiment of the inventive concept.

FIG. 16 is a block diagram illustrating a host 161 including a data writing device 161_2 and a memory 162 according to an exemplary embodiment of the inventive concept. As illustrated in FIG. 16, the host 161 may include a processor 161_1 and the data writing device 161_2.

The data writing device 161_2 may be used for the memory 162. The memory 162 may be a stand-alone memory. For example, as illustrated in FIG. 16, the data writing device 161_2 may include the controller CTR, the first write buffer WB1, and the second write buffer WB2, and may be included in the host 161 together with the processor 161_1. In response to a write request from the processor 161_1, the data writing device 161_2 may write, to the memory 162, write data efficiently as described above with reference to the figures.

Figure 17:
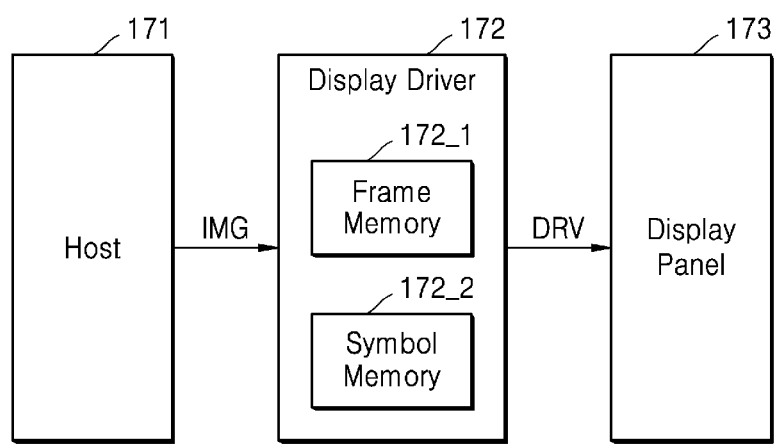
FIG. 17 is a block diagram illustrating a display system including a data writing device according to an exemplary embodiment of the inventive concept.

FIG. 17 is a block diagram illustrating a display system 170 including a data writing device according to an exemplary embodiment of the inventive concept. As illustrated in FIG. 17, the display system 170 may include a host 171, a display driver 172, and a display panel 173. The data writing devices described above with reference to exemplary embodiments of the inventive concept may be included in the display driver 172. The display system 170 may include, but is not limited to, a mobile device such as a mobile phone, a smartphone, a tablet personal computer (PC), or the like and a fixed device such as a television (TV), a monitor, or the like.

The host 171 may provide, to the display driver 172, image data IMG including, information about an image output through the display panel 173. The display driver 172 may provide a driving signal DRV for driving the display panel 173 to the display panel 173 based on the image data IMG, and may be referred to as a display driver integrated circuit (DDI). The display panel 173 may output an image according to the driving signal DRV.

The display driver 172 may include a frame memory 172_1 and a symbol memory 172_2 as illustrated in FIG. 17. The frame memory 172_1 may store the image data IMG, and may be a graphics random access memory (GRAM). While a still image is output through the display panel 173, data stored in the frame memory 172_1 may not be updated with the image data IMG received from the host 171, and the display panel 173 may output an image corresponding to the data stored in the frame memory 172_1. The symbol memory 172_1 may store data corresponding to a predefined image, e.g., a symbol image. For example, the symbol memory 172_2 may store data corresponding to a particular image, character, number, sign, or the like. The host 171 may control the display driver 172 so that the display panel 173 may output the symbol image, and the display panel 173 may output the symbol image corresponding to data stored in the symbol memory 172_2. In exemplary embodiments of the inventive concept, the host 171 may change the symbol image by changing the data stored in the symbol memory 172_2.

The data writing devices described above with reference to exemplary embodiments of the inventive concept may be included in the frame memory 172_1 and/or the symbol memory 172_2. For example, stored data may be frequently read from the symbol memory 172_2 to output the symbol image, but data may not be frequently written to the symbol memory 172_2 by the host 171. Therefore, the symbol memory 172_2 may include a non-volatile memory having a lifespan sensitive to the number of times it is written, and the data writing device may be included in the symbol memory 172_2 together with the non-volatile memory. Accordingly, data corresponding to the symbol image may be efficiently written to the symbol memory 172_2, and may not be lost even when power supplied to the display system 170 is cut off, and thus, the Stepan of the symbol memory 172_2 and the lifespan of the display driver 172 may be extended.

While the inventive concept has been particularly shown and described with reference to exemplary embodiments thereof, it will be understood that various changes in form and details may be made thereto without departing from the spirit and scope of the inventive concept as set forth in the following claims.

What is claimed is:

1. A method of controlling a memory, the method comprising:
    receiving a write request including a write command, write data, and a write address;
    writing, in response to the write command, the write data to a first write buffer having a first data width that matches a width of the write data;
    writing first data stored in the first write buffer to a second write buffer based on the write address and an address of second data stored in the second write buffer, the second write buffer having a second data width that matches a data width of the memory and is, greater than the first data width;
    writing the second data to the memory based on the write address and the address of the and data stored in the second write buffer,
    receiving a read request including a read command and a read address;
    reading third data from the memory and writing the third data to a read buffer having the second data width in response to the read command; and
    outputting read data having the first data width and stored in the read buffer,
    wherein the writing of the first data to the second write buffer comprises:
    updating the third data by writing the first data to the read buffer when a region of the memory corresponding to the write address is included in a region of the memory corresponding to an address of the third data; and
    writing, to the second write buffer, the updated third data from the read buffer as the second data.

2. A device for controlling a memory, the device comprising:
    a first write buffer having a first data width that matches a width of write data included in a write request and wherein the first write buffer is configured to store the write data;
    a second write buffer having a second data width that matches a data width of the memory and is greater than the first data width;
    a controller configured to, based on a write address included in the write request and an address of the second data stored in the second write buffer, write first data stored in the first write buffer to the second write buffer and write the second data stored in the second write buffer to the memory; and
    a read buffer configured to output read data having the first data width, the read buffer having the second data width,
    wherein the controller is further configured to read third data from the memory, write the third data to the read buffer in response to a read command included in a read request and select the read data from the third data based on a read address included in the read request,
    wherein the controller is further configured to update the third data by writing the first data to the read buffer without writing the first data to the second write buffer when a region of the memory corresponding to the write address is included in a region of the memory corresponding to an address of the third data, and
    wherein the controller is further configured to write the updated third data from the read buffer to the second write buffer.

3. The device of claim 2, wherein the controller writes the first data to the second write buffer when the region of the memory corresponding to the write address is included in a region of the memory corresponding to the address of the second data.

4. The device of claim 2, wherein, when the region of the memory corresponding to the write address is not included in a region of the memory corresponding to the address of the second data and the second data is entirely updated with the first data, the controller writes the second data to the memory.

5. The device of claim 2, wherein, when the region of the memory corresponding to the write address is not included in a region of the memory corresponding to the address of the second data and the second data includes a portion not updated with the first data, the controller reads a portion of data from the memory to update the second data, and writes the updated second data to the memory.

6. The device of claim 2, wherein the controller comprises a register configured to store setting information for a setting operation of the controller.

7. The device of claim 6, wherein the controller repeatedly writes the second data based on the setting information.

8. The device of claim 6, wherein each of the first write buffer and the second write buffer is reconfigurable, and
    the controller sets a first depth of the first write buffer and a second depth of the second write buffer based on the setting information.

9. The device of claim 2, wherein the controller writes the second data to the memory in an idle mode.

10. The device of claim 9, wherein the controller writes the first data to the second write buffer and determines that the second data stored in the second write buffer is in an entirely updated state when the region of the memory corresponding to the write address received after the idle mode is ended is included in a region of the memory corresponding to the address of the second data.

11. The device of claim 9, wherein the controller writes the first data to the second write buffer and determines that only a portion corresponding to the first data of the second data stored in the second write buffer is in an updated state when the region of the memory corresponding to the write address received after the idle mode is ended is not included in a region of the memory corresponding to the address of the second data.

12. The device of claim 2, wherein the device is embedded in an integrated circuit together with a system bus and a processor connected to the system bus, and receives the write request from the system bus, and
the first data width matches a data width supported by the system bus.

13. The device of claim 2, Wherein the memory comprises a phase change memory, a phase change memory and switch (PCMS), a resistive random access memory (RRAM), a ferroelectric memory, a spin-transfer torque random access memory (STT-RAM), a spin tunneling random access memory (STRAM), a magnetoresistive memory, a magnetic memory, a magnetic random access memory (MRAM), or semiconductor-oxide-nitride-oxide-semiconductor (SONOS) memory.

14. A device for controlling a memory, the device comprising:
a first write buffer having a first data width that matches a width of write data included in a write request and wherein the first write buffer is configured to store the write data;
a second write buffer having a second data width that matches a data width of the memory and is greater than the first data width;
a controller configured to update a portion of second data with first data stored in the first write buffer when a region of the memory corresponding to a write address included in the write request is included in a region of the memory corresponding to an address of the second data stored in the second write buffer so that a hit occurs in the second write buffer, and to write the second data to the memory based on an update state of the second data when the region of the memory corresponding to the write address included in the write request is not included in the region of the memory corresponding to the address of the second data stored in the second write buffer so that a miss occurs in the second write buffer; and
a read buffer configured to output read data having the first data width, the read buffer having the second data width,
wherein the controller is further configured to read third data from the memory, write the third data to the read buffer in response to a read command included in a read request and update the third data by writing the first data to the read buffer without writing the first data to the sec write buffer when the region of the memory corresponding to the write address is included in a region of the memory corresponding to an address of the third data, and
wherein the controller is further configured to write the updated third data from the read buffer to the second write buffer.

15. The device of claim 14, wherein the controller sets the update state of the second data to:
an entirely invalid state in which the second data is entirely not updated;
a partially valid state in which the portion of the second data is not updated;
or the entirely valid state in which the second data is entirely updated.

16. The device of claim 15, wherein, when entering an idle mode, the controller sets the second data to a backup state by writing the second data to the memory after switching the second data to the entirely valid state.

* * * * *